(12) United States Patent
Lytle

(10) Patent No.: US 10,665,596 B2
(45) Date of Patent: *May 26, 2020

(54) SELF ALIGNED ACTIVE TRENCH CONTACT

(71) Applicant: Texas Instruments Incorporated, Dallas, TX (US)

(72) Inventor: Steven Alan Lytle, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/167,984

(22) Filed: Oct. 23, 2018

(65) Prior Publication Data

US 2019/0057969 A1  Feb. 21, 2019

Related U.S. Application Data

(60) Continuation of application No. 15/467,608, filed on Mar. 23, 2017, now Pat. No. 10,134,746, which is a
(Continued)

(51) Int. Cl.
*H01L 21/8238* (2006.01)
*H01L 27/11* (2006.01)
(Continued)

(52) U.S. Cl.
CPC ........ *H01L 27/1104* (2013.01); *H01L 21/283* (2013.01); *H01L 21/32053* (2013.01); *H01L 21/7684* (2013.01); *H01L 21/76837* (2013.01); *H01L 21/76877* (2013.01); *H01L 21/76897* (2013.01); *H01L 21/8238* (2013.01); *H01L 21/823468* (2013.01); *H01L 21/823475* (2013.01); *H01L 21/823828* (2013.01); *H01L 21/823842* (2013.01); *H01L 21/823864* (2013.01); *H01L 21/823871* (2013.01); *H01L 23/485* (2013.01); *H01L 23/5226* (2013.01); *H01L 23/535* (2013.01);
(Continued)

(58) Field of Classification Search
None
See application file for complete search history.

(56) References Cited

U.S. PATENT DOCUMENTS 9,245,894 B2 * 1/2016 Lytle ............... H01L 29/665
2007/0221998 A1 9/2007 Park
(Continued)

*Primary Examiner* — Minh Loan Tran
(74) *Attorney, Agent, or Firm* — Andrew R. Ralston; Charles A. Brill; Frank D. Cimino

(57) ABSTRACT

An integrated circuit and method includes self-aligned contacts. A gapfill dielectric layer fills spaces between sidewalls of adjacent MOS gates. The gapfill dielectric layer is planarized down to tops of gate structures. A contact pattern is formed that exposes an area for multiple self-aligned contacts. The area overlaps adjacent instances of the gate structures. The gapfill dielectric layer is removed from the area. A contact metal layer is formed in the areas where the gapfill dielectric material has been removed. The contact metal abuts the sidewalls along the height of the sidewalls. The contact metal is planarized down to the tops of the gate structures, forming the self-aligned contacts.

24 Claims, 27 Drawing Sheets

Related U.S. Application Data continuation of application No. 14/970,707, filed on Dec. 16, 2015, now Pat. No. 9,460,539, which is a division of application No. 14/563,203, filed on Dec. 8, 2014, now Pat. No. 9,245,894.

(60) Provisional application No. 61/915,152, filed on Dec. 12, 2013.

(51) Int. Cl.

| | | |
|---|---|---|
| *H01L 21/768* | (2006.01) | |
| *H01L 21/283* | (2006.01) | |
| *H01L 21/3205* | (2006.01) | |
| *H01L 29/66* | (2006.01) | |
| *H01L 21/8234* | (2006.01) | |
| *H01L 27/118* | (2006.01) | |
| *H01L 29/06* | (2006.01) | |
| *H01L 27/092* | (2006.01) | |
| *H01L 23/485* | (2006.01) | |
| *H01L 27/02* | (2006.01) | |
| *H01L 23/522* | (2006.01) | |
| *H01L 23/535* | (2006.01) | |

(52) U.S. Cl.
CPC ........ *H01L 27/0207* (2013.01); *H01L 27/092* (2013.01); *H01L 27/1116* (2013.01); *H01L 27/11807* (2013.01); *H01L 29/0649* (2013.01); *H01L 29/665* (2013.01); *H01L 29/6653* (2013.01); *H01L 29/6656* (2013.01); *H01L 29/66515* (2013.01); *H01L 29/66545* (2013.01); *H01L 29/66606* (2013.01); *H01L 21/76831* (2013.01); *H01L 2924/0002* (2013.01)

(56) References Cited

U.S. PATENT DOCUMENTS

| | | |
|---|---|---|
| 2011/0156107 A1 | 6/2011 | Bohr et al. |
| 2014/0264479 A1 | 9/2014 | Cai et al. |
| 2015/0021683 A1 | 1/2015 | Xie et al. |

\* cited by examiner

SELF ALIGNED ACTIVE TRENCH CONTACT

CROSS-REFERENCE TO RELATED APPLICATIONS

This application is a continuation of U.S. Nonprovisional patent application Ser. No. 15/467,608 filed Mar. 23, 2017, which is a continuation of U.S. Nonprovisional patent application Ser. No. 14/970,707, filed Dec. 16, 2015 (now U.S. Pat. No. 9,640,539), which is a divisional of U.S. Nonprovisional patent application Ser. No. 14/563,203, filed Dec. 8, 2014 (now U.S. Pat. No. 9,245,894), and claims the benefit of U.S. Provisional Application Ser. No. 61/915,152, filed Dec. 12, 2013, the contents of all of which are herein incorporated by reference in its entirety.

FIELD OF THE INVENTION

This invention relates to the field of integrated circuits. More particularly, this invention relates to metal oxide semiconductor (MOS) transistors in integrated circuits.

BACKGROUND OF THE INVENTION

It may be desirable for contacts to source/drain regions of MOS transistors on advanced technology nodes, for example, 45 nanometer node and beyond, to provide uniform low resistance electrical connections. It may further be desirable to form the contacts with a process sequence that has sufficient process latitude to provide a desired cost of fabrication for an integrated circuit containing the contacts.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit and method includes self-aligned contacts. A gapfill dielectric layer fills spaces between sidewalls of adjacent MOS gates. The gapfill dielectric layer is planarized down to tops of gate structures. A contact pattern is formed that exposes an area for multiple self-aligned contacts. The area overlaps adjacent instances of the gate structures. The gapfill dielectric layer is removed from the area. A contact metal layer is formed in the areas where the gapfill dielectric material has been removed. The contact metal abuts the sidewalls along the height of the sidewalls. The contact metal is planarized down to the tops of the gate structures, forming the self-aligned contacts.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit may be formed with self-aligned contacts by a process of forming a gapfill dielectric layer over the integrated circuit which fills spaces between sidewalls on MOS gates and planarizing the gapfill dielectric layer down to tops of gate structures containing the MOS gates. A contact pattern is formed over the gapfill dielectric layer and gate structures which exposes areas for the self-aligned contacts; the areas for the self-aligned contacts overlap adjacent instances of the gate structures. The gapfill dielectric layer is removed from the areas for the self-aligned contacts, and the contact pattern is subsequently removed. A contact metal layer is formed over the integrated circuit, on the gate structures and extending to source/drain regions where the gapfill dielectric material has been removed; the contact metal abuts the sidewalls along the height of the sidewalls. The contact metal is planarized down to the tops of the gate structures, forming the self-aligned contacts.

A replacement gate process may optionally be performed prior to formation of the contact metal layer or after formation of the contact metal layer. Metal silicide on the source/drain regions may be formed prior to formation of the gapfill dielectric layer or after the gapfill dielectric layer is removed from the areas for the self-aligned contacts. The contact pattern may also expose areas for local interconnects extending over field oxide.

A pre-metal dielectric (PMD) layer may be formed over the self-aligned contacts and vias formed through the PMD layer to make electrical connections to at least a portion of the self-aligned contacts. A first level of metal interconnects may be formed on the vias.

Figure 1A:
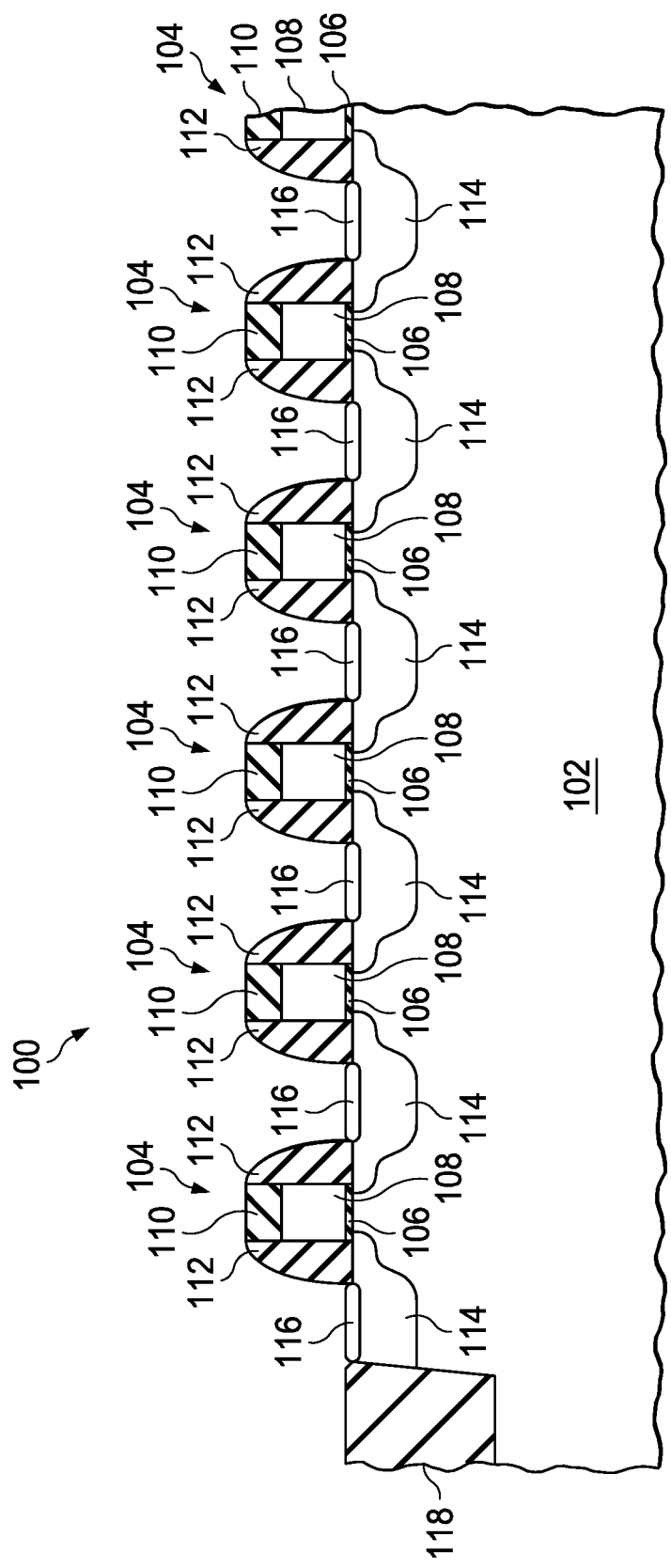
FIG. 1A through FIG. 1J are cross sections of an example integrated containing self-aligned contacts, depicted in successive stages of fabrication.

FIG. 1A through FIG. 1J are cross sections of an example integrated containing self-aligned contacts, depicted in successive stages of fabrication. Referring to FIG. 1A, the integrated circuit 100 is formed in and on a substrate 102 which includes semiconductor material. The substrate 102 may be, for example, a single crystal silicon wafer, a silicon-on-insulator (SOI) wafer, a hybrid orientation technology (HOT) wafer with regions of different crystal orientations, or other material appropriate for fabrication of the integrated circuit 100.

The integrated circuit 100 includes gate structures 104 which include a gate dielectric layer 106 formed on the substrate 102, and an MOS gate 108 formed on the gate dielectric layer 106. Hard mask material 110 from a prior gate etch process may possibly be remaining over the MOS gates 108 and thus be included in the gate structures 104. The MOS gate 108 and the gate dielectric layer 106 may possibly be sacrificial elements which will be replaced later in a gate replacement sequence. Alternatively, the MOS gate 108 and the gate dielectric layer 106 may be permanent elements of the integrated circuit 100. The gate structures 104 also include sidewalls 112 adjacent to the MOS gate 108. The sidewalls 112 may have outer surfaces of silicon nitride to provide a desired selectivity to a subsequent contact etch. The gate structures 104 may be, for example, 50 nanometers to 250 nanometers high.

Source/drain regions 114 are formed in the substrate 102 adjacent to the gate structures 104. In the instant example, metal silicide 116 is formed on the source/drain regions 114 prior to formation of a gapfill dielectric layer, which may advantageously provide lower and more uniform series resistance through the source/drain regions 114. Instances of the gate structures 104 may be spaced at a minimum distance prescribed by design rules applicable to the integrated circuit 100. In the instant example, field oxide 118 is formed in the substrate 102 to laterally isolate instances of the gate structures 104 from other components of the integrated circuit 100.

Figure 1B:
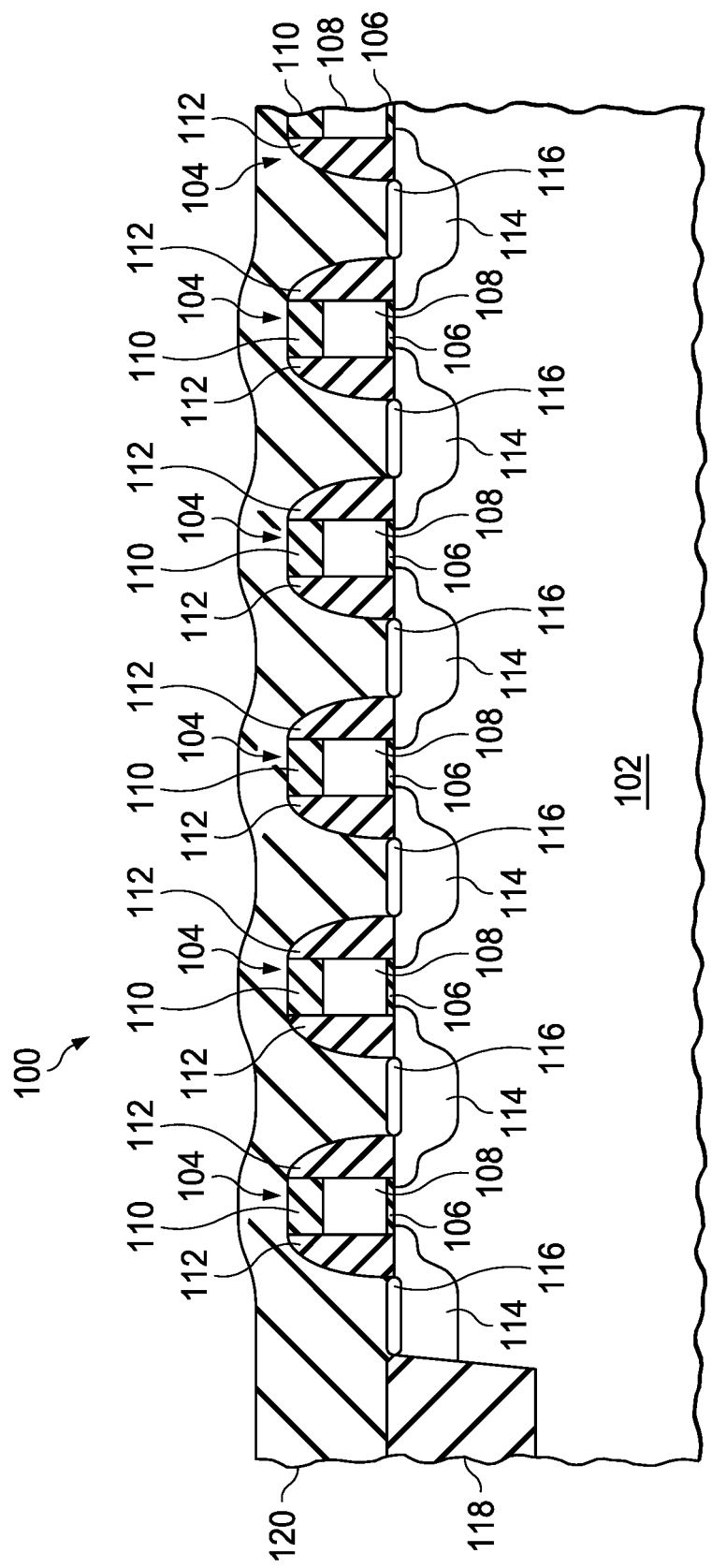

Referring to FIG. 1B, a gapfill dielectric layer 120 is formed over the integrated circuit 100, extending to the metal silicide 116 adjacent to the gate structures 104. The gapfill dielectric layer 120 may be primarily silicon dioxide. The gapfill dielectric layer 120 may be formed, for example, by a plasma enhanced chemical vapor deposition (PECVD) process using tetraethyl orthosilicate, also known as tetraethoxysilane or TEOS, formed by a sub-atmospheric chemical vapor deposition (SACVD) process using ozone and TEOS, or formed using a spin coat solution of methylsilsesquioxane (MSQ). Other dielectric materials in the gapfill dielectric layer 120 formed by other processes, which provide a desired selectivity in a subsequent contact etch process to the sidewalls 112, are within the scope of the instant example. The gapfill dielectric layer 120 may include an etch stop sublayer of silicon nitride, not shown, over the metal silicide 116 and the sidewalls 112.

Figure 1C:
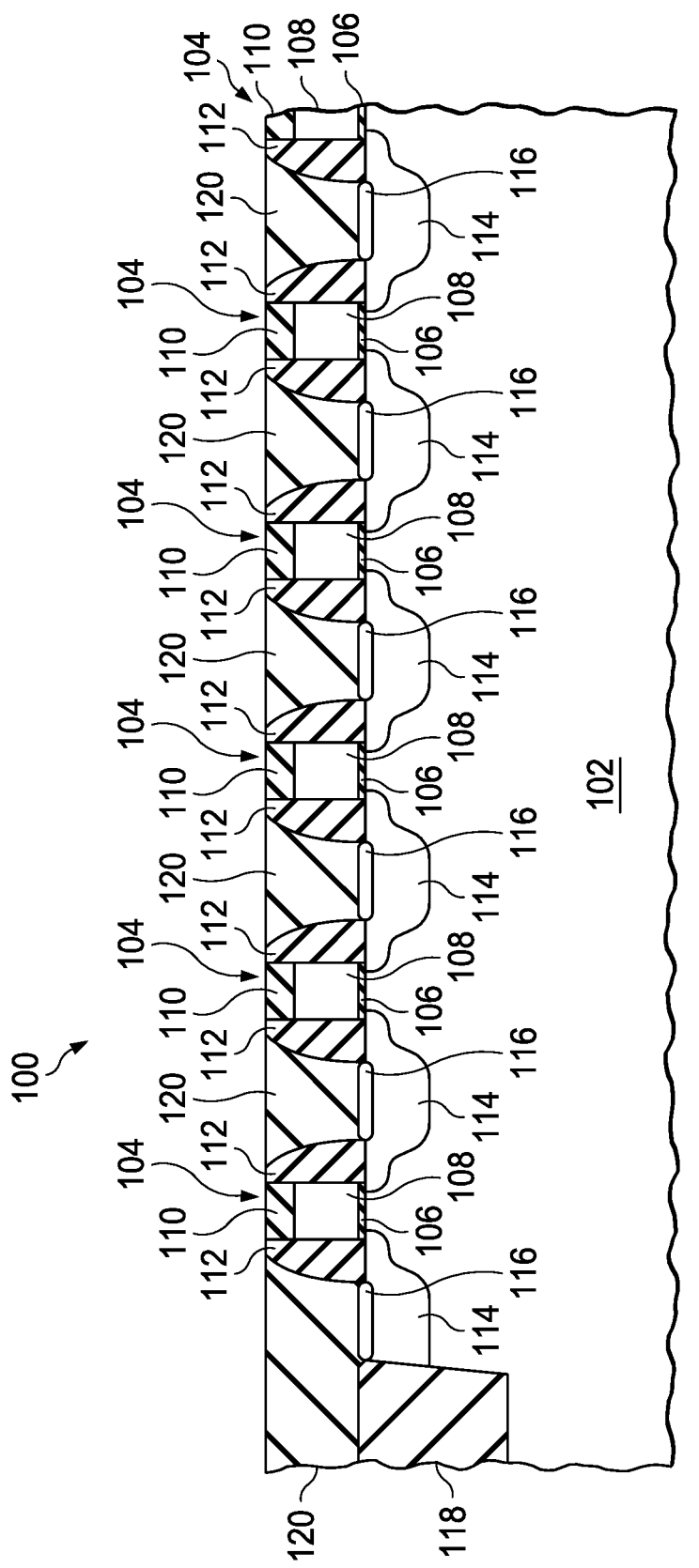

Referring to FIG. 1C, a planarization process removes the gapfill dielectric layer 120 over the MOS gates 108 so that a top surface of the gapfill dielectric layer 120 is substantially coplanar with top surfaces of the gate structures 104. The planarization process may include a chemical mechanical polish (CMP) process. The planarization process may include an etchback process in which a planarizing layer of polymer is formed by a spin coat process over the gapfill dielectric layer 120 and a subsequent isotropic plasma etch process removes the polymer and the gapfill dielectric layer 120 at substantially equal rates so as to planarize the gapfill dielectric layer 120. The MOS gates 108 may possibly be exposed by the planarization process.

Figure 1D:
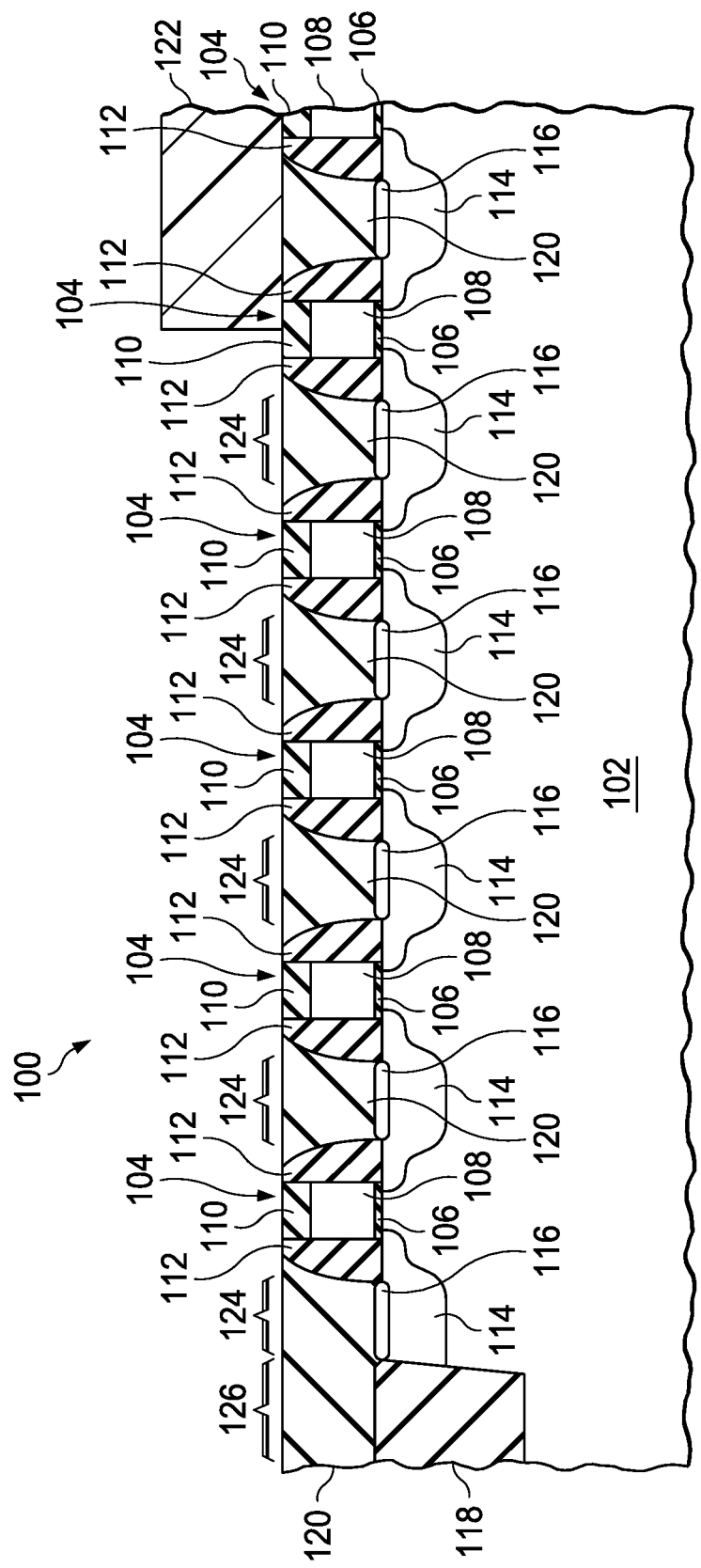

Referring to FIG. 1D, a contact mask 122 is formed over the gapfill dielectric layer 120 so as to expose areas for self-aligned contacts 124. The areas for the self-aligned contacts 124 overlap the sidewalls 112 of adjacent instances of the gate structures 104. The contact mask 122 may further expose areas over the field oxide 118 for local interconnects 126. The contact mask 122 may include, for example, photoresist formed by a photolithographic process. Forming the contact mask 122 to expose a contiguous area for adjacent instances of the self-aligned contacts 124 may advantageously provide a desired level of process latitude for the photolithographic process used to form the contact mask 122 compared to exposing an individual opening for each desired contact.

Figure 1E:
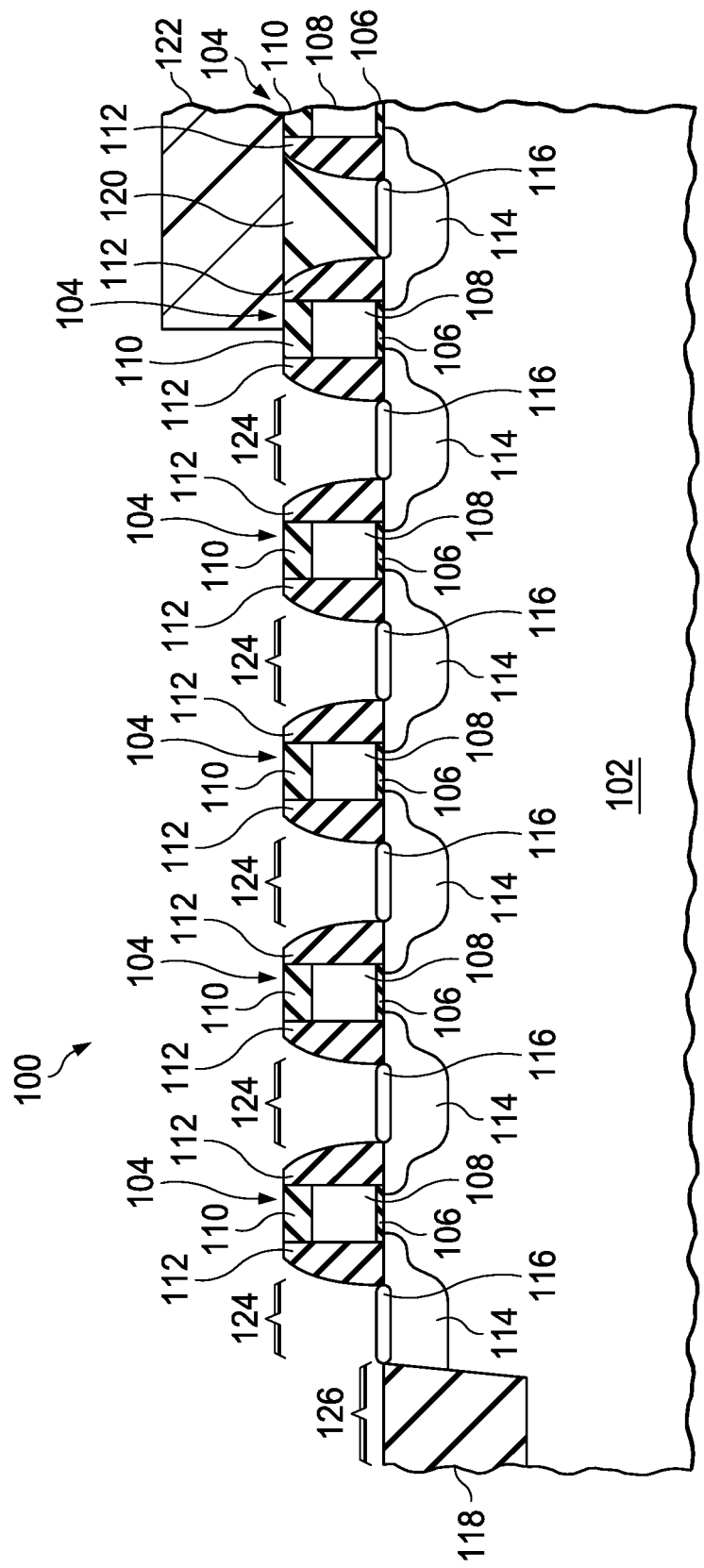

Referring to FIG. 1E, a contact etch process removes the gapfill dielectric layer 120 in the areas exposed by the contact mask 122. The metal silicide 116 on the source/drain regions 114 is exposed by the contact etch process. The contact etch process may include, for example, a wet etch using an aqueous buffered hydrofluoric acid solution and/or a plasma etch process. The contact etch process leaves at least acceptable portions of the sidewalls 112 and metal silicide 116 in place. The contact mask 122 is removed after the contact etch process is completed.

Figure 1F:
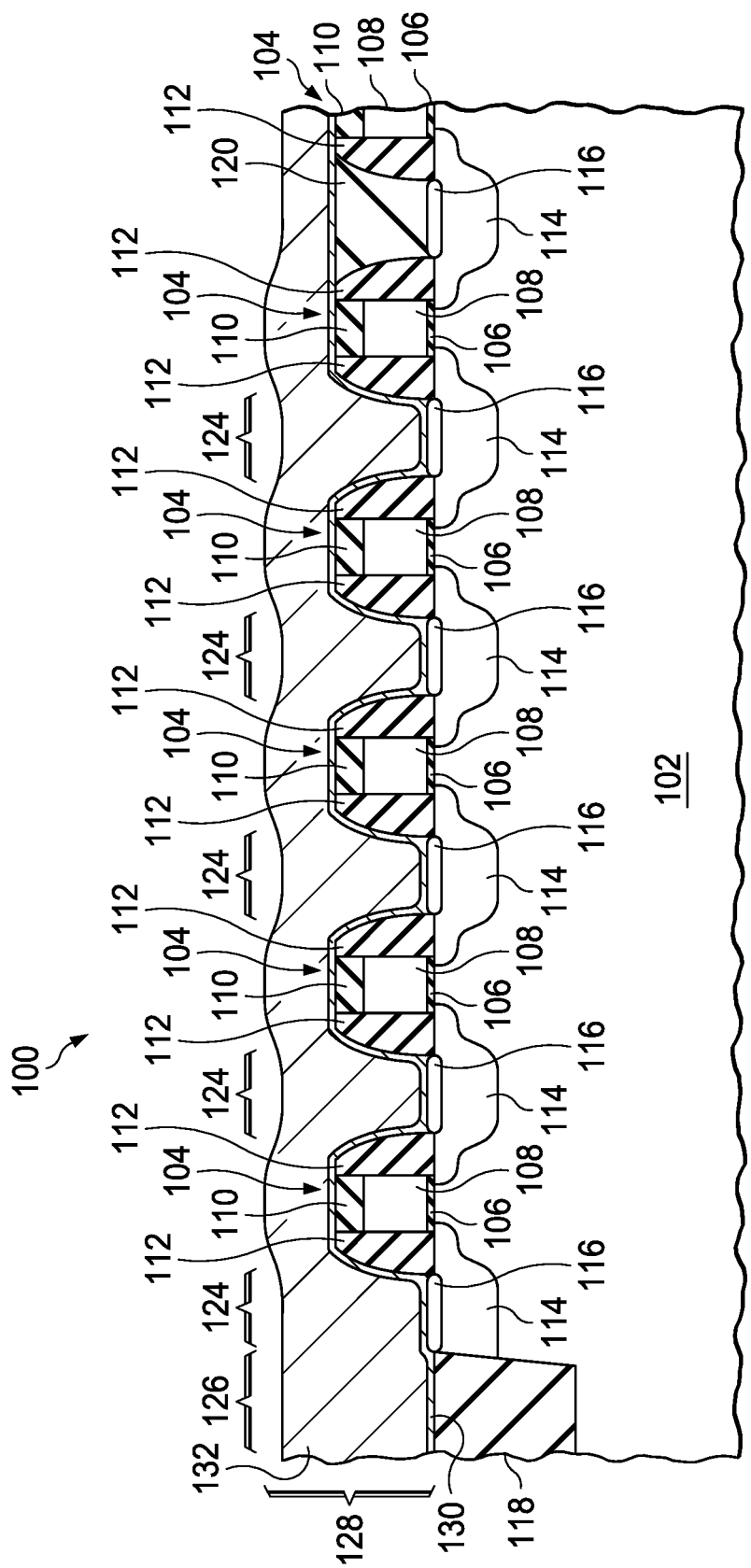

Referring to FIG. 1F, a layer of contact metal 128 is formed on the integrated circuit 100 extending to and contacting the metal silicide 116 on the source/drain regions 114, contacting the sidewalls 112 along their heights, and contacting tops of the gate structures 104. The layer of contact metal 128 may include, for example, a liner 130 of sputtered titanium and titanium nitride formed by atomic layer deposition (ALD), and a fill metal 132 of tungsten formed by metal organic chemical vapor deposition (MOCVD) using tungsten hexafluoride reduced by silane and hydrogen. The layer of contact metal 128 may be, for example, 50 nanometers to 200 nanometers thicker than the gate structures 104.

Figure 1G:
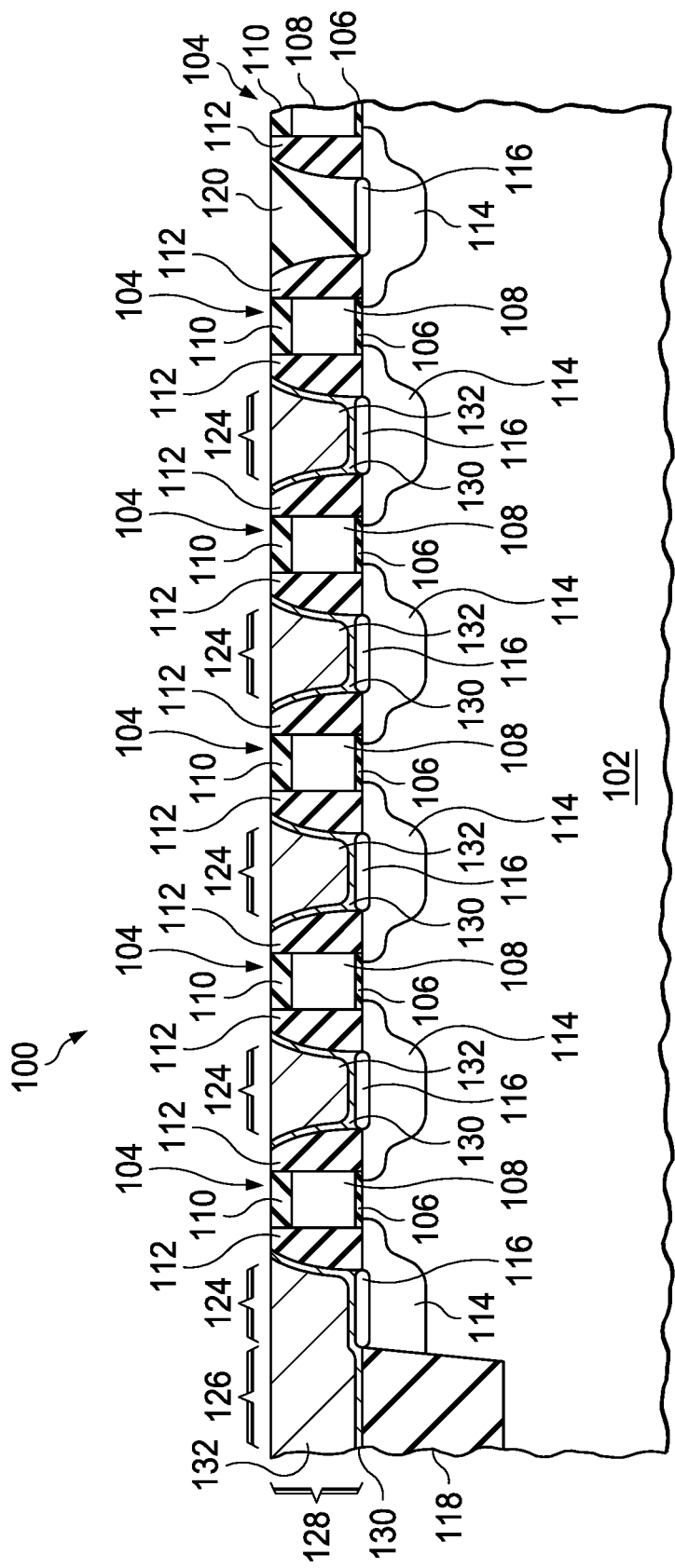

Referring to FIG. 1G, a planarization process removes the contact metal 128 over the MOS gates 108 so that a top surface of the contact metal 128 is substantially coplanar with top surfaces of the gate structures 104. The planarization process may include a CMP process followed by a plasma etchback process. Instances of the contact metal 128 between adjacent instances of the sidewalls 112 and contacting the metal silicide 116 provide the self-aligned contacts 124. Forming the self-aligned contacts 124 so as to contact the adjacent sidewalls 112 along their heights may provide low and uniform resistance of the self-aligned contacts 124. Instances of the contact metal 128 extending over the field oxide 118 to other components of the integrated circuit 100 may provide the optional local interconnects 126.

Figure 1H:
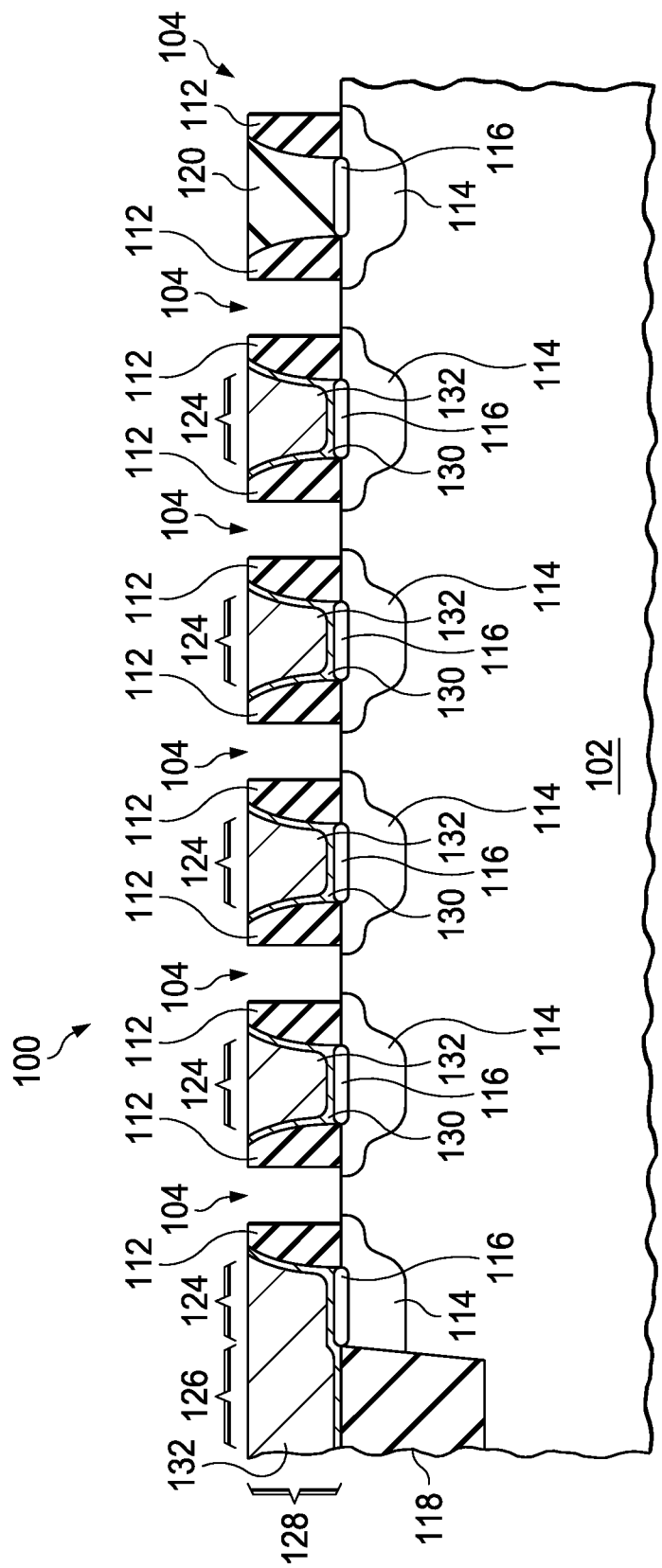

Referring to FIG. 1H, the hard mask material 110 if present, the MOS gates 108 and gate dielectric layers 106 of FIG. 1G may optionally be removed as part of a gate replacement process. The MOS gates 108 may be removed, for example, using a wet etch process with aqueous tetramethyl ammonium hydroxide (TMAH). The gate dielectric layers 106 may be removed, for example, using a wet etch process with aqueous buffered dilute hydrofluoric acid.

Figure 1I:
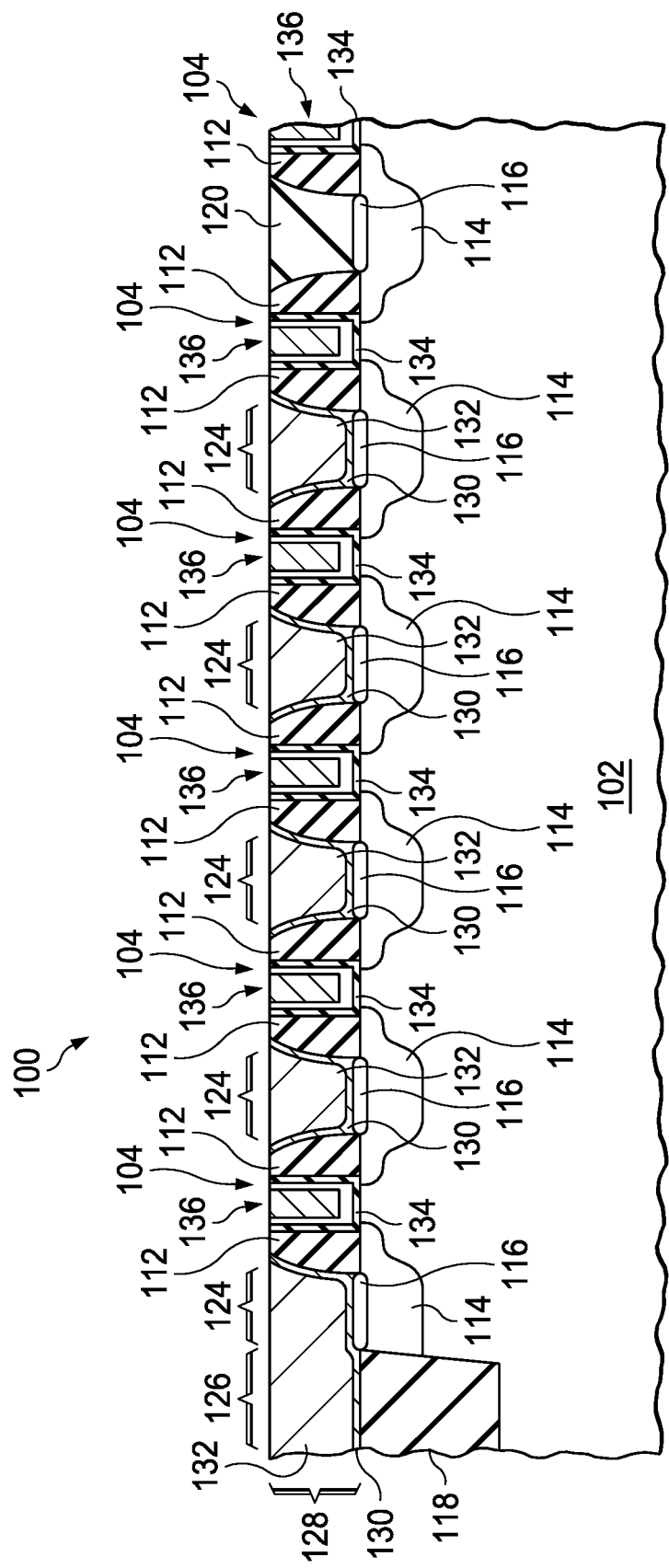

Referring to FIG. 1I, replacement gate dielectric layers 134 and replacement gates 136 are formed in the gate structures 104 as part of the gate replacement process. The replacement gate dielectric layers 134 may include dielectric materials with high dielectric constants such as hafnium oxide, zirconium oxide or tantalum oxide. The replacement gate dielectric layers 134 may contact the sidewalls 112 along their heights. The replacement gates 136 may include one or more metal layers such as titanium and titanium nitride, and may include low resistance fill material such as aluminum.

Figure 1J:
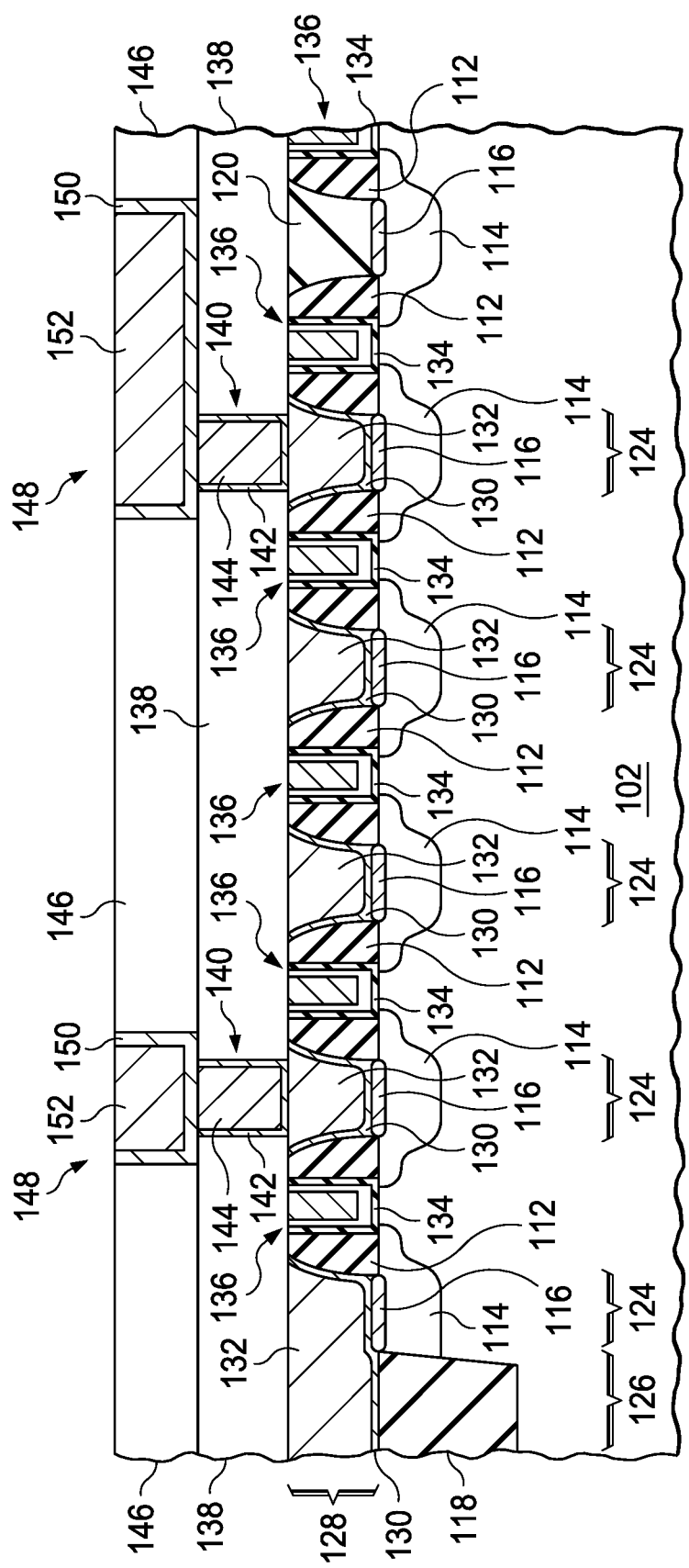

Referring to FIG. 1J, a PMD layer 138 is formed over the gate structures 104 and the self-aligned contacts 124. The PMD layer 138 may include, for example, a silicon nitride etch stop 5 nanometers to 20 nanometers thick deposited by PECVD, a layer of silicon dioxide, phospho-silicate glass (PSG) or boro-phospho-silicate glass (BPSG), 100 nanometers to 300 nanometers thick deposited by PECVD and leveled by a CMP process, and an optional PMD cap layer, 5 nanometers to 20 nanometers silicon nitride, silicon carbide nitride or silicon carbide.

Vias 140 are formed through the PMD layer 138 so as to make electrical connections to instances of the self-aligned contacts 124. The vias 140 may be formed, for example, by etching via holes through the PMD layer 138, forming a liner 142 of titanium and titanium nitride on the PMD layer 138 extending into the via holes and contacting the self-aligned contacts 124, and forming a layer of fill metal 144 of tungsten on the liner 142. The liner 142 and the fill metal 144 may be subsequently removed from a top surface of the PMD layer 138 by CMP and/or etchback processes, leaving the vias 140.

An intra-metal dielectric (IMD) layer 146 is formed over the PMD layer 138. The IMD layer 146 may include, for example, a silicon carbide etch stop 5 nanometers to 20 nanometers thick, a layer of low-k dielectric material such as organo-silicate glass (OSG) or carbon-doped silicon oxides (SiCO or CDO), 100 nanometers to 300 nanometers thick, and an optional IMD cap layer, 5 nanometers to 20 nanometers silicon nitride.

Metal interconnects 148 are formed in the IMD layer 146 so as to make electrical connections to the vias 140. The metal interconnects 148 may be formed, for example, using a copper single damascene process, having a tantalum nitride liner 150 and a copper fill metal 152.

Figure 2A:
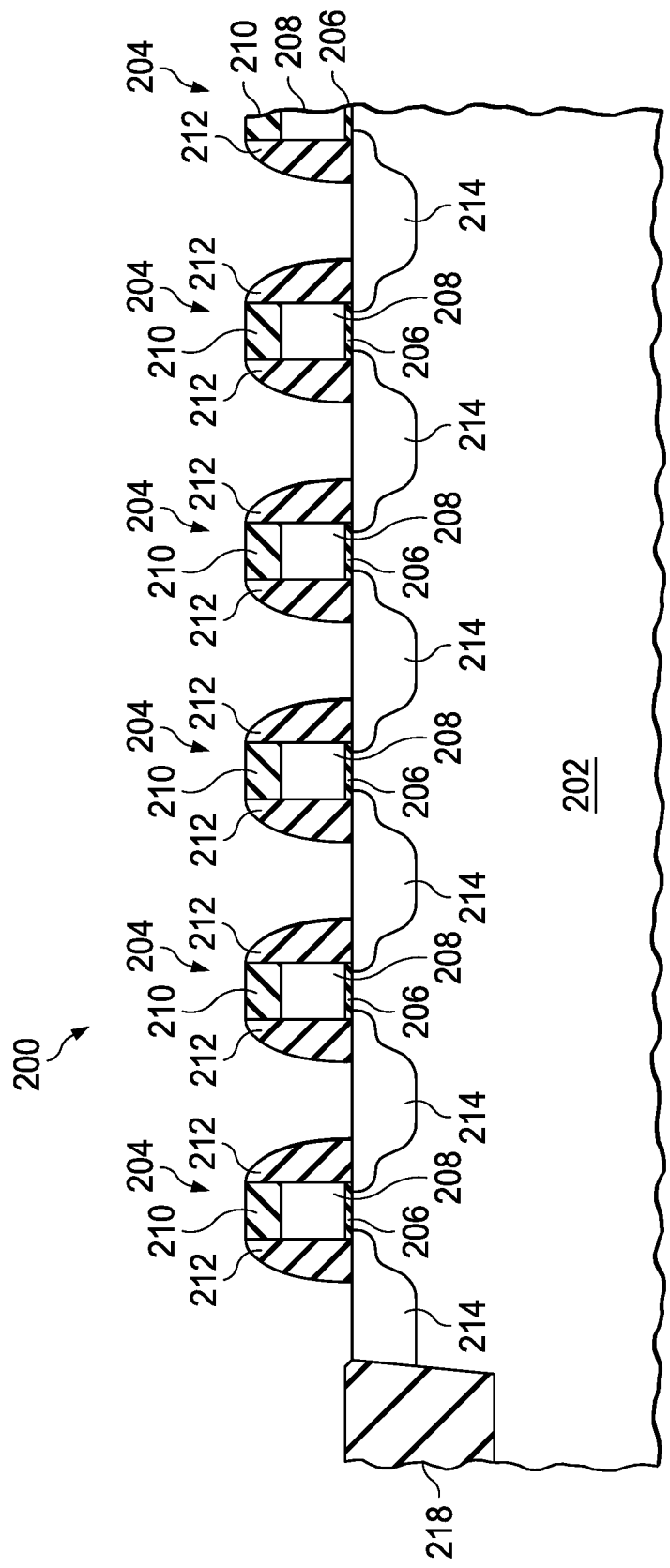
FIG. 2A through FIG. 2K are cross sections of another example integrated containing self-aligned contacts, depicted in successive stages of fabrication.

FIG. 2A through FIG. 2K are cross sections of another example integrated containing self-aligned contacts, depicted in successive stages of fabrication. Referring to FIG. 2A, the integrated circuit 200 is formed in and on a substrate 202 as described in reference to FIG. 1A, which includes semiconductor material. The integrated circuit 200 includes gate structures 204 which include a gate dielectric layer 206 formed on the substrate 202, an MOS gate 208 formed on the gate dielectric layer 206, and hard mask material 210, if present, over the MOS gates 208. The MOS gate 208 and the gate dielectric layer 206 may possibly be sacrificial elements which will be replaced later in a gate replacement sequence, or may be permanent elements of the integrated circuit 200. The gate structures 204 also include sidewalls 212 adjacent to the MOS gate 208, as described in reference to FIG. 1A. The gate structures 204 may be, for example, 50 nanometers to 250 nanometers high. Source/drain regions 214 are formed in the substrate 202 adjacent to the gate structures 204. In the instant example, metal silicide 216 is not formed on the source/drain regions 214 prior to formation of a gapfill dielectric layer.

Figure 2B:
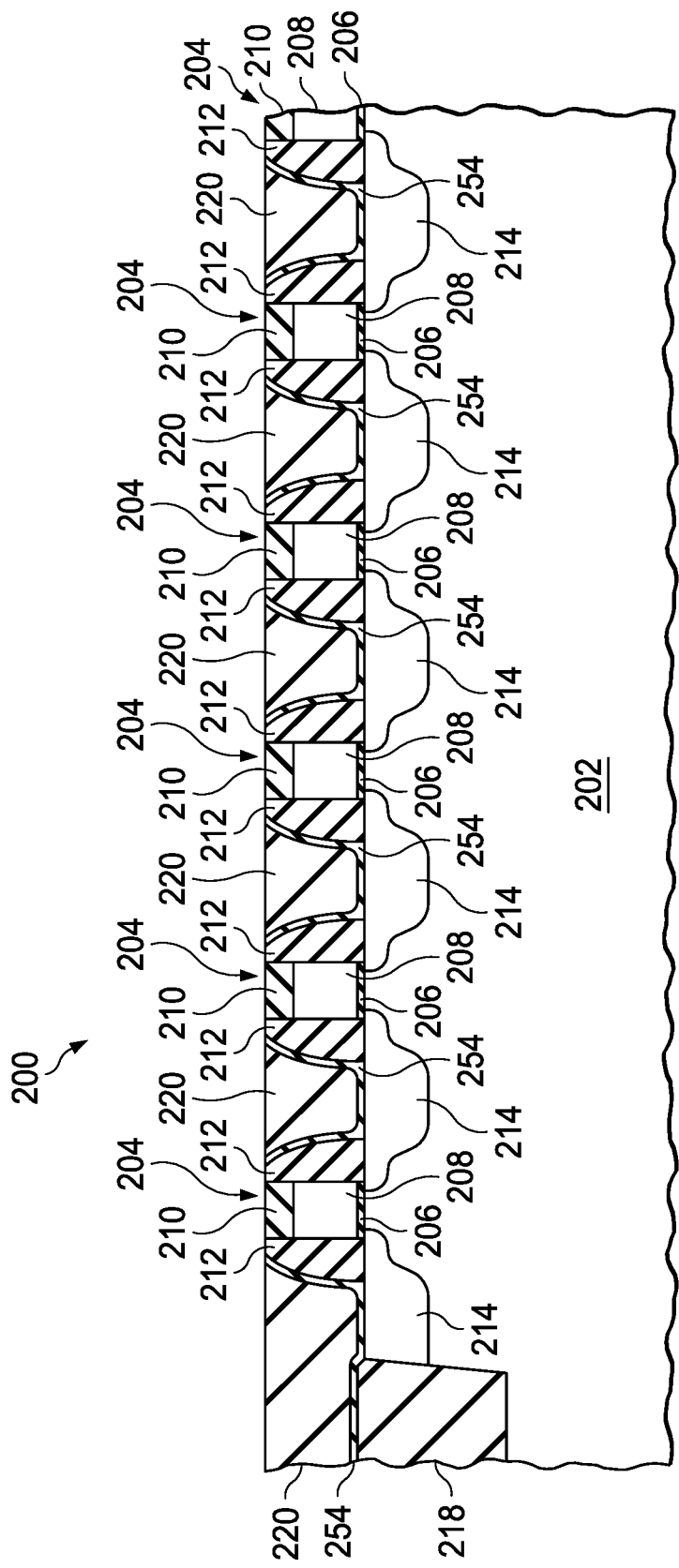

Referring to FIG. 2B, a sidewall extension layer 254 is formed on the sidewalls 212 and the source/drain regions 214, after formation of the source/drain regions 214. The sidewall extension layer 254 may be, for example, 1 nanometer to 10 nanometers of silicon nitride, formed by a PECVD process using bis (tertiary-butylamino) silane (BT-BAS). The sidewall extension layer 254 may provide an etch stop layer for a subsequently formed gapfill dielectric layer. The sidewall extension layer 254 is considered part of the gate structures 204.

A gapfill dielectric layer 220 is formed over the integrated circuit 200, extending to the substrate 202 adjacent to the gate structures 204. The gapfill dielectric layer 220 may be primarily silicon dioxide, and may be formed as described in reference to FIG. 1B. A planarization process removes the gapfill dielectric layer 220 and the sidewall extension layer 254 over the MOS gates 208 so that a top surface of the gapfill dielectric layer 220 is substantially coplanar with top surfaces of the gate structures 204, as described in reference to FIG. 1C.

Figure 2C:
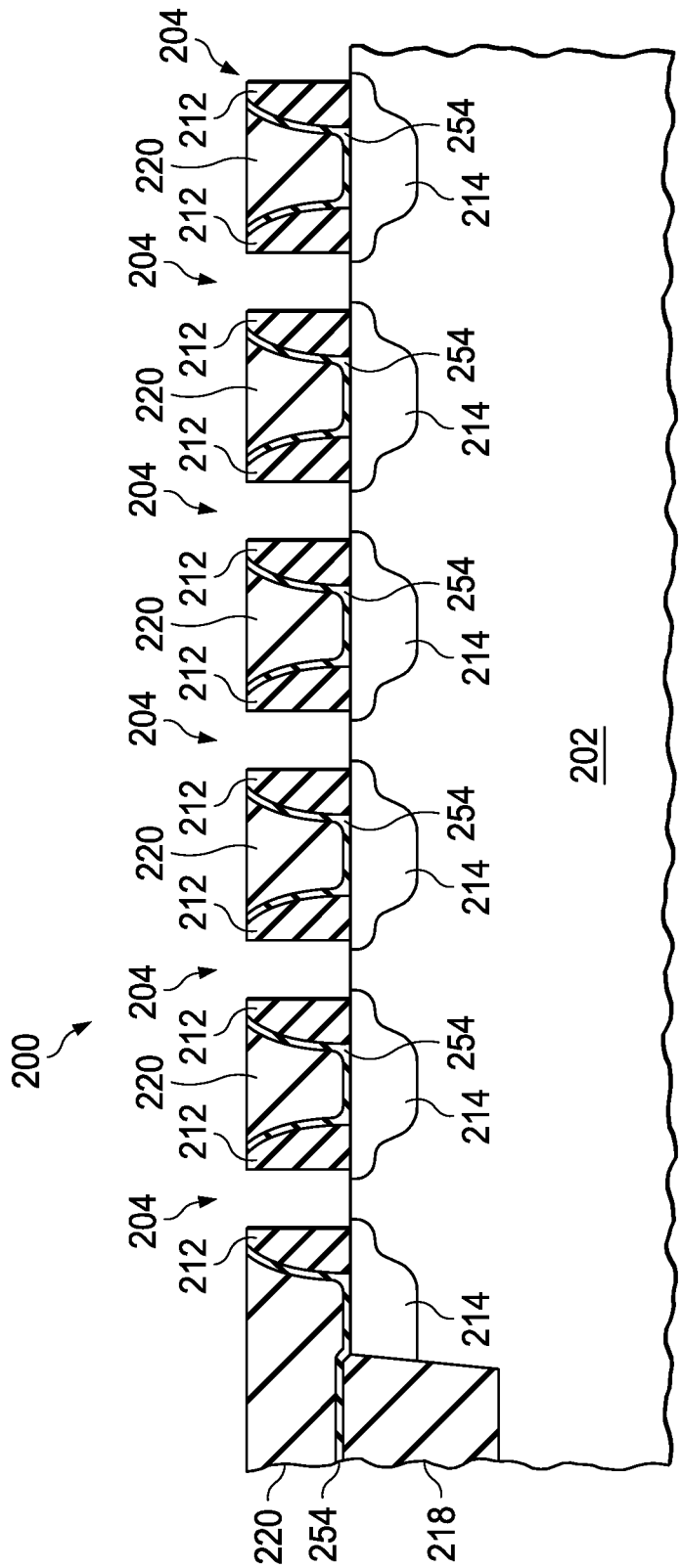

Referring to FIG. 2C, the hard mask material 210 if present, the MOS gates 208 and gate dielectric layers 206 of FIG. 2B may optionally be removed as part of a gate replacement process. The MOS gates 208 and the gate dielectric layers 206 may be removed, for example, as described in reference to FIG. 1H.

Figure 2D:
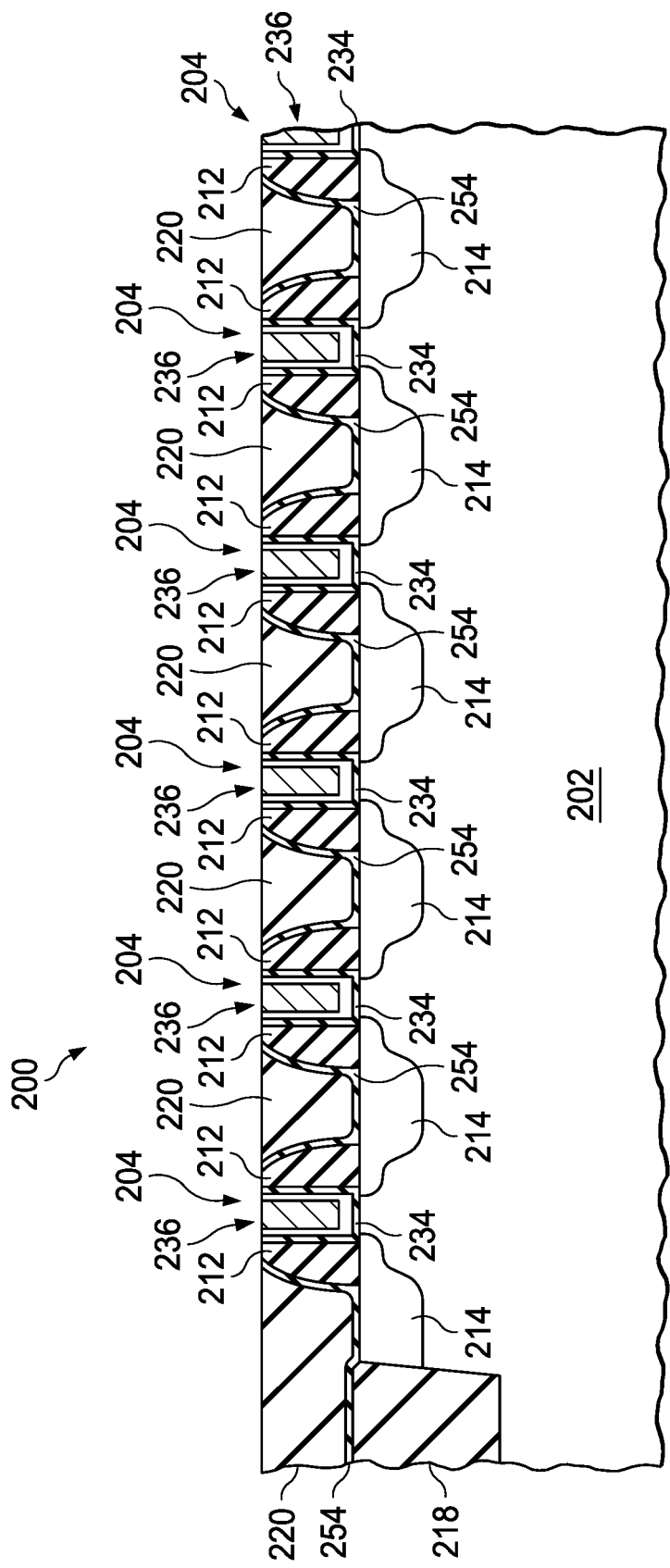

Referring to FIG. 2D, replacement gate dielectric layers 234 and replacement gates 236 are formed in the gate structures 204 as part of the gate replacement process. The replacement gate dielectric layers 234 and replacement gates 236 may be formed, for example, as described in reference to FIG. 1I.

Figure 2E:
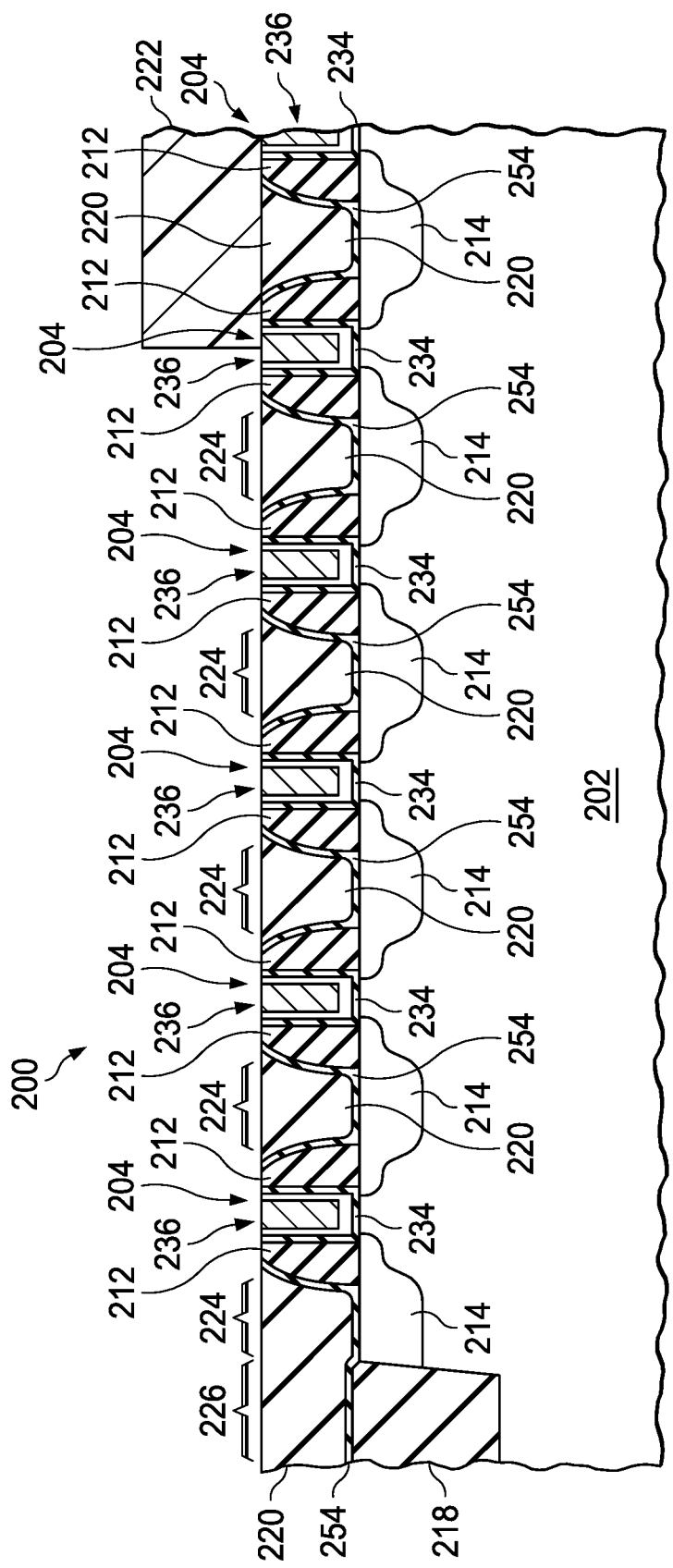

Referring to FIG. 2E, a contact mask 222 is formed over the gapfill dielectric layer 220 so as to expose areas for self-aligned contacts 224 as described in reference to FIG. 1D. The areas for the self-aligned contacts 224 overlap the sidewall extension layer 254 on adjacent instances of the gate structures 204. The contact mask 222 may further expose areas over the field oxide 218 for local interconnects 226.

Figure 2F:
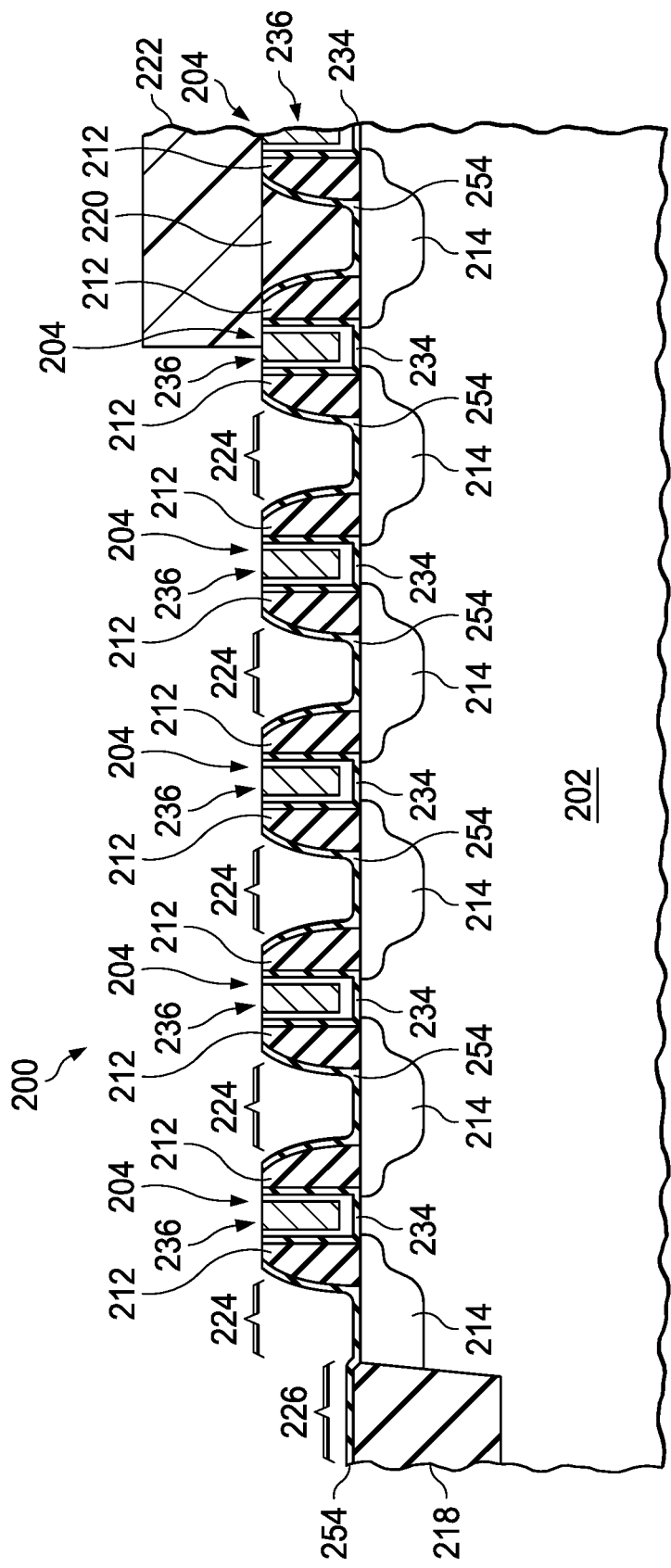

Referring to FIG. 2F, a contact etch process removes the gapfill dielectric layer 220 in the areas exposed by the contact mask 222. At least a portion of the sidewall extension layer 254 remains after the contact etch process is completed. The contact etch process may include a wet etch and/or a plasma etch as described in reference to FIG. 1E. In the instant example, the sidewall extension layer 254 may provide an etch stop for the contact etch process. In an alternate version of the instant example, the sidewall extension layer 254 may be formed after removal of the gapfill dielectric layer 220.

Figure 2G:
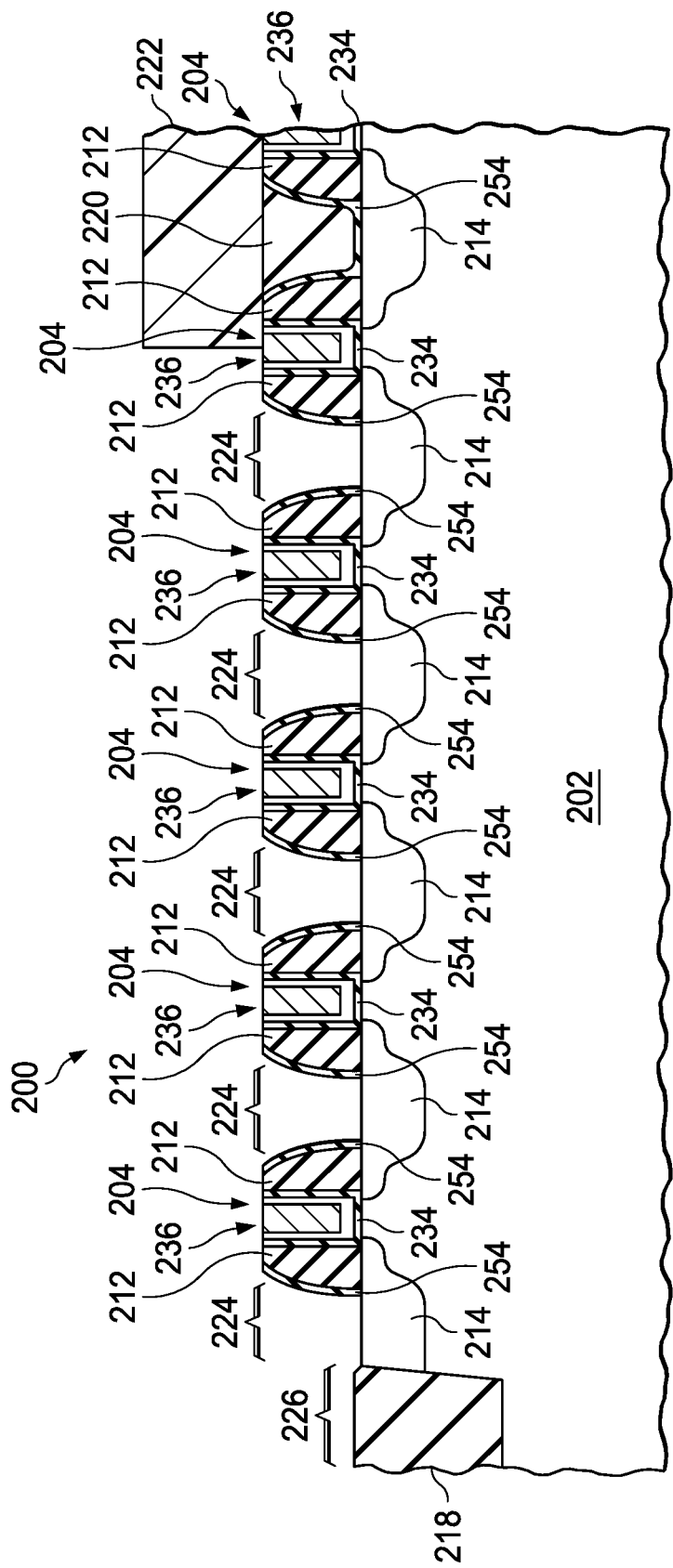

Referring to FIG. 2G, an anisotropic etch process removes the sidewall extension layer 254 on the source/drain regions 214 while leaving at least a portion of the sidewall extension layer 254 on the sidewalls 212. The anisotropic etch process may include, for example an RIE step. The contact mask 222 is removed after the anisotropic etch process is completed.

Figure 2H:
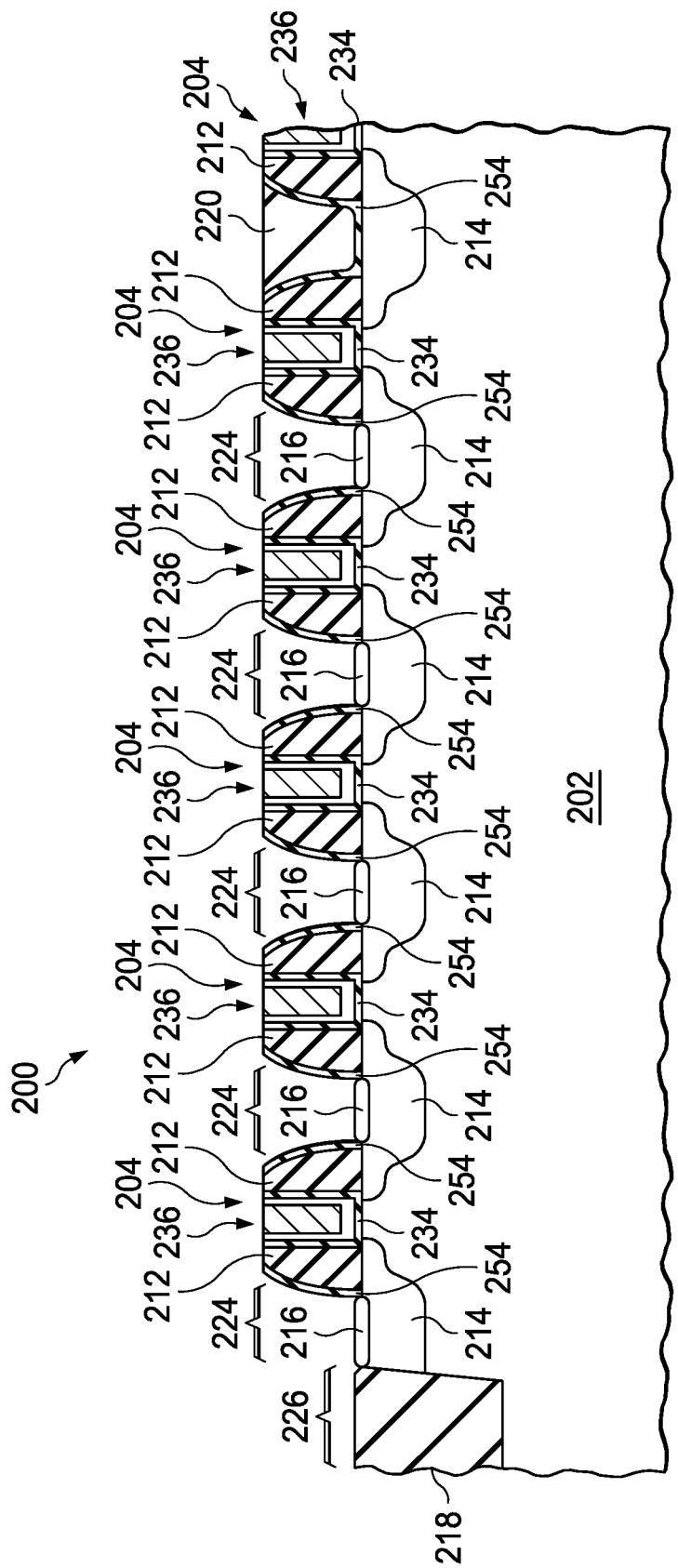

Referring to FIG. 2H, metal silicide 216 is formed on the source/drain regions 214. Forming the metal silicide 216 after the anisotropic etch process removes the sidewall extension layer 254 on the source/drain regions 214 may advantageously provide a desired separation between the metal silicide 216 and the replacement gates 236, independent of the sidewalls 212 which were used to establish lateral extents of doping distributions in the source/drain regions 214.

Figure 2I:
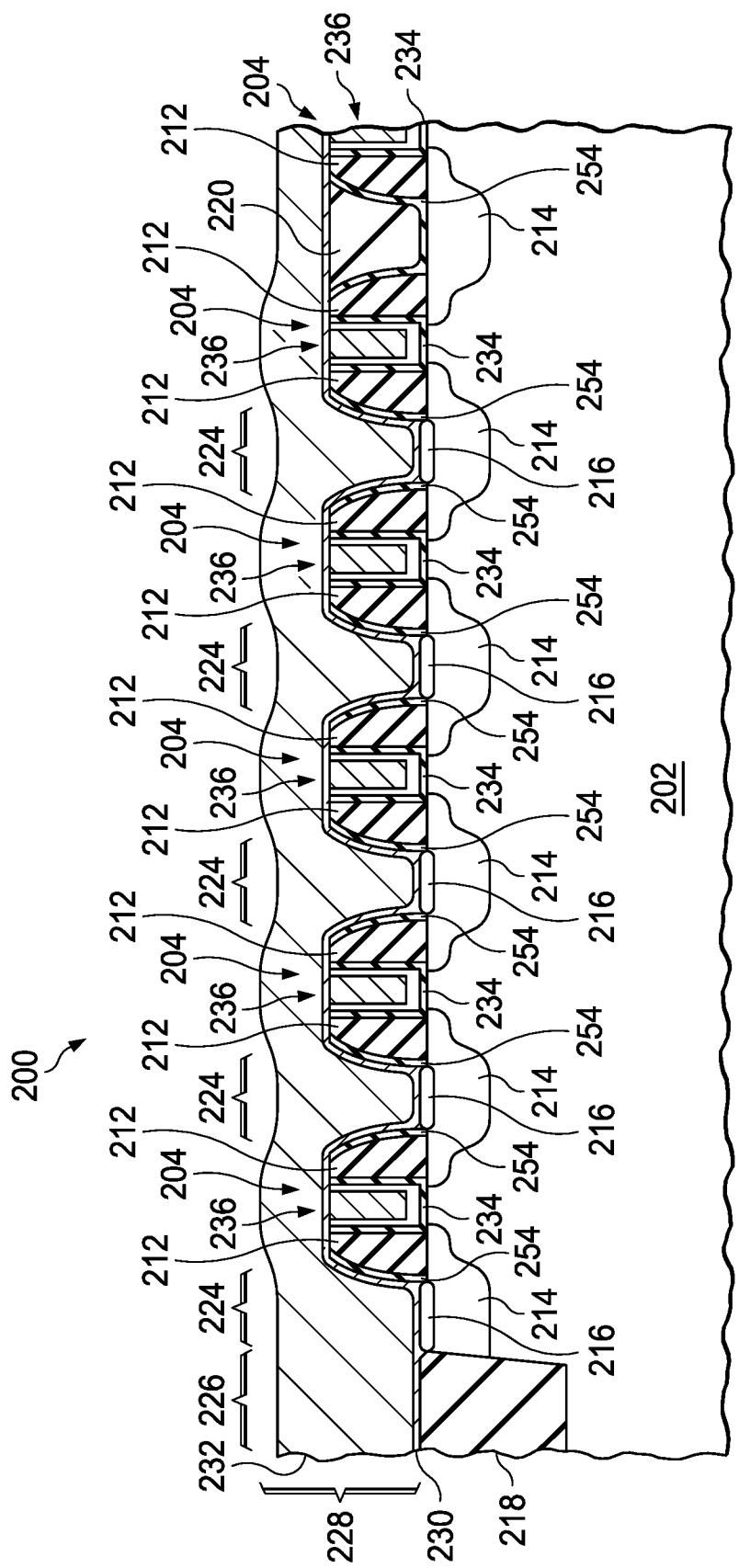

Referring to FIG. 2I, a layer of contact metal 228 is formed on the integrated circuit 200 extending to and contacting the metal silicide 216 on the source/drain regions 214, contacting the sidewall extension layer 254 along heights of the gate structures 204, and contacting tops of the gate structures 204. The layer of contact metal 228 may include, for example, a liner 230 of sputtered titanium and titanium nitride, and a fill metal 232 of tungsten as described in reference to FIG. 1F. The layer of contact metal 228 may be, for example, 50 nanometers to 200 nanometers thicker than the gate structures 204.

Figure 2J:
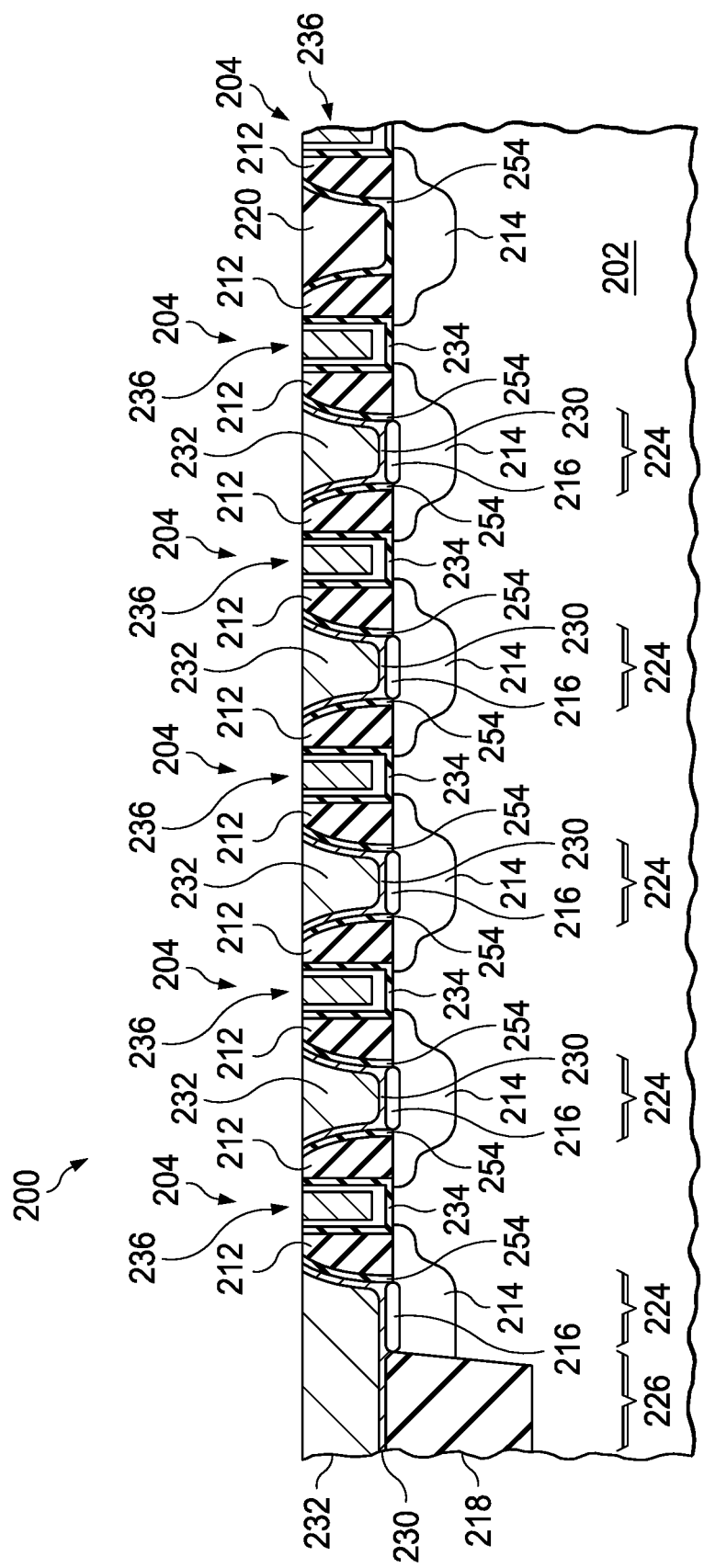

Referring to FIG. 2J, a planarization process removes the contact metal 228 over the MOS gates 208 so that a top surface of the contact metal 228 is substantially coplanar with top surfaces of the gate structures 204, as described in reference to FIG. 1G. Instances of the contact metal 228 between adjacent instances of the sidewall extension layer 254 and contacting the metal silicide 216 provide the self-aligned contacts 224. Forming the self-aligned contacts 224 so as to contact the sidewall extension layer 254 along the heights of the gate structures 204 may provide low and uniform resistance of the self-aligned contacts 224. Instances of the contact metal 228 extending over the field oxide 218 to other components of the integrated circuit 200 may provide the optional local interconnects 226.

Figure 2K:
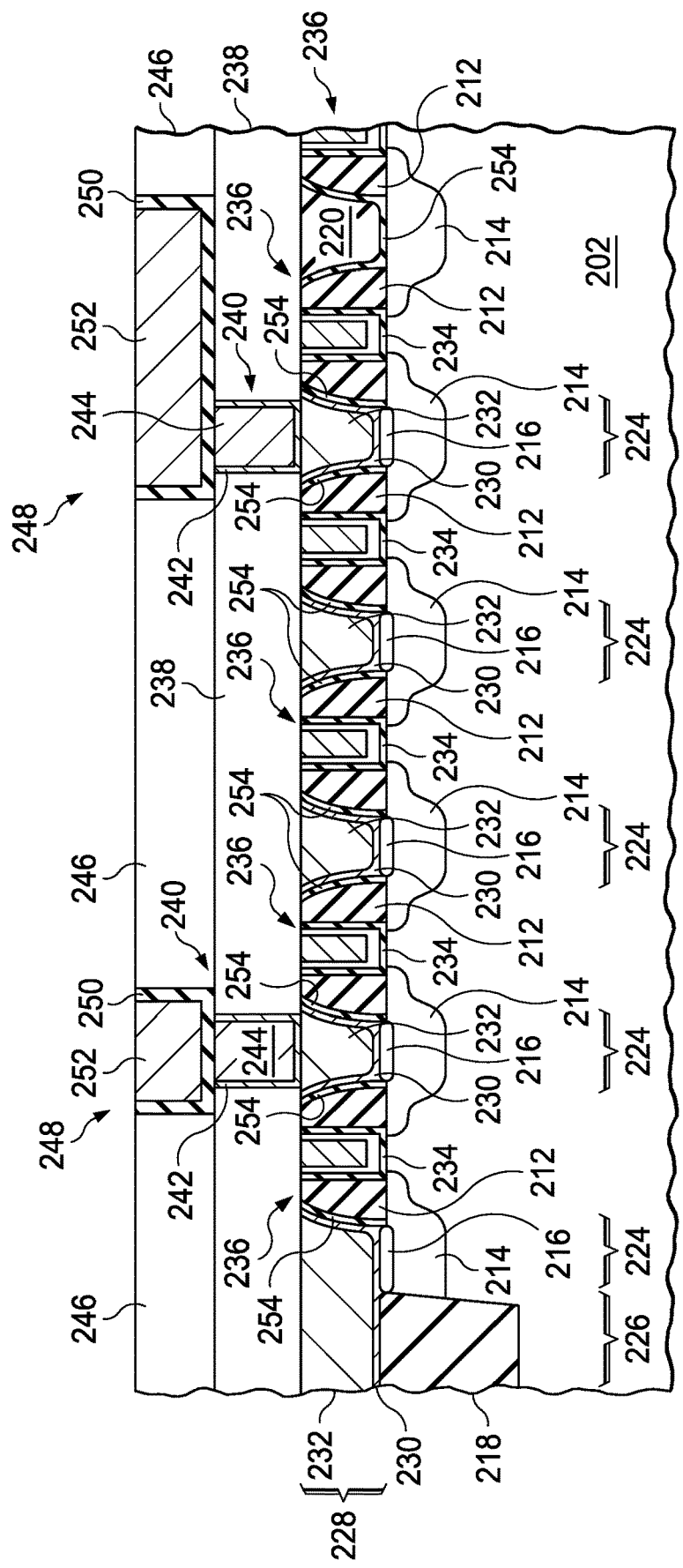

Referring to FIG. 2K, a PMD layer 238 is formed over the gate structures 204 and the self-aligned contacts 224 as described in reference to FIG. 1J. Vias 240, possibly including a liner 242 and a fill metal 244, are formed through the PMD layer 238 so as to make electrical connections to instances of the self-aligned contacts 224 as described in reference to FIG. 1J. An IMD layer 246 is formed over the PMD layer 238 as described in reference to FIG. 1J. Metal interconnects 248, possibly including a tantalum nitride liner 250 and a copper fill metal 252, are formed in the IMD layer 246 so as to make electrical connections to the vias 240 as described in reference to FIG. 1J.

Figure 3A:
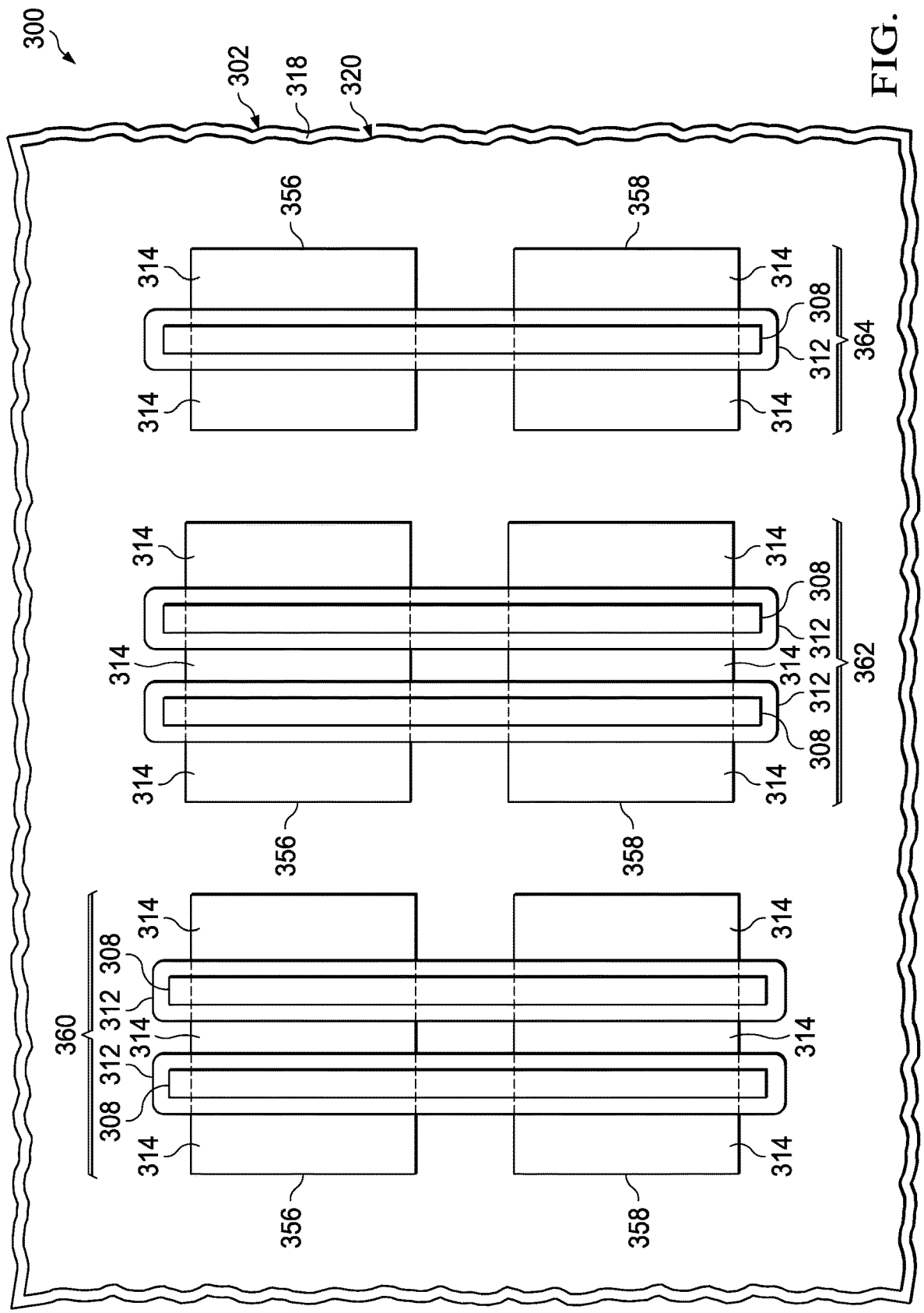
FIG. 3A through FIG. 3C are top views of an example integrated circuit containing self-aligned contacts in logic gates, depicted in successive stages of fabrication.
Figure 3B:
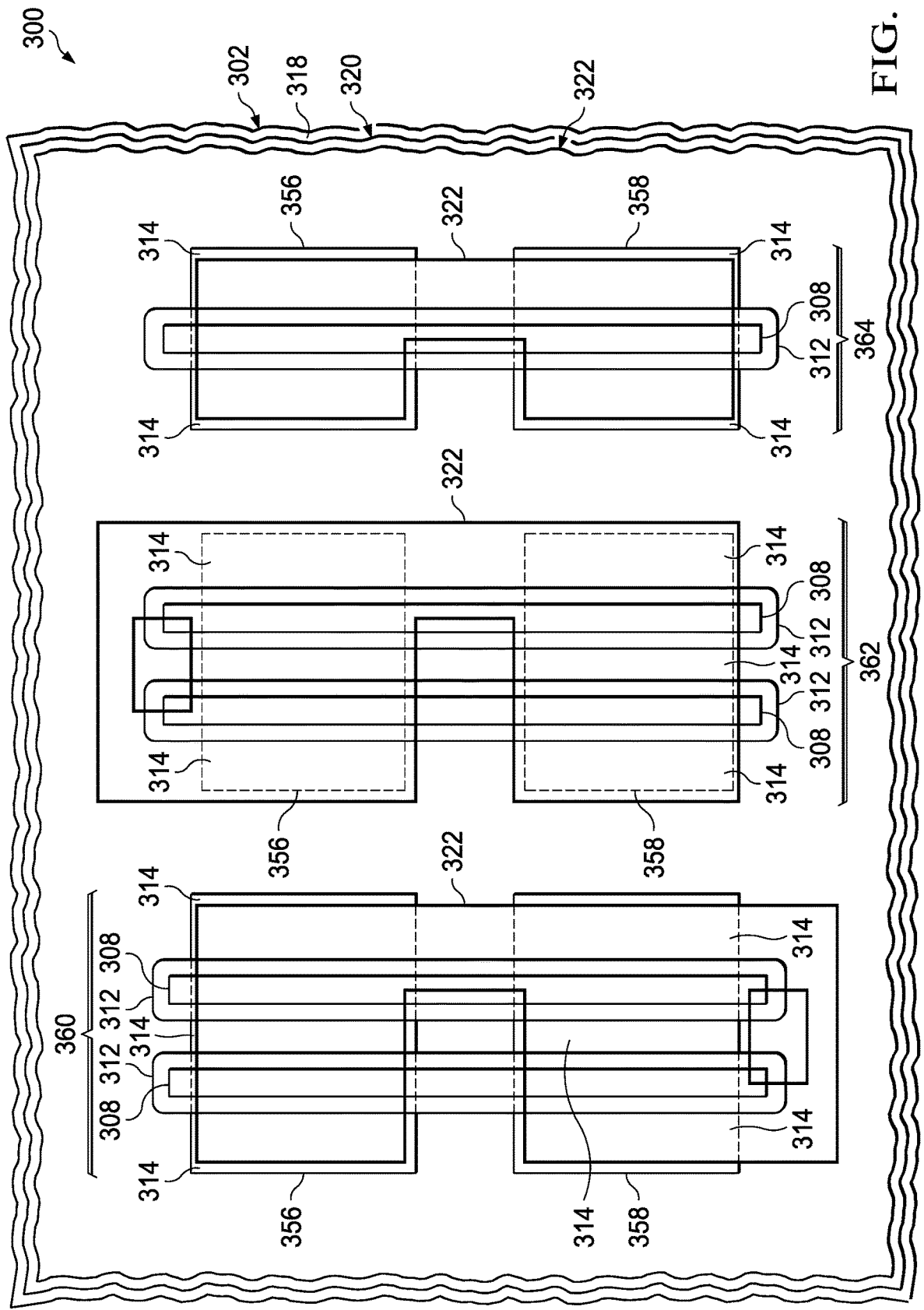
Figure 3C:
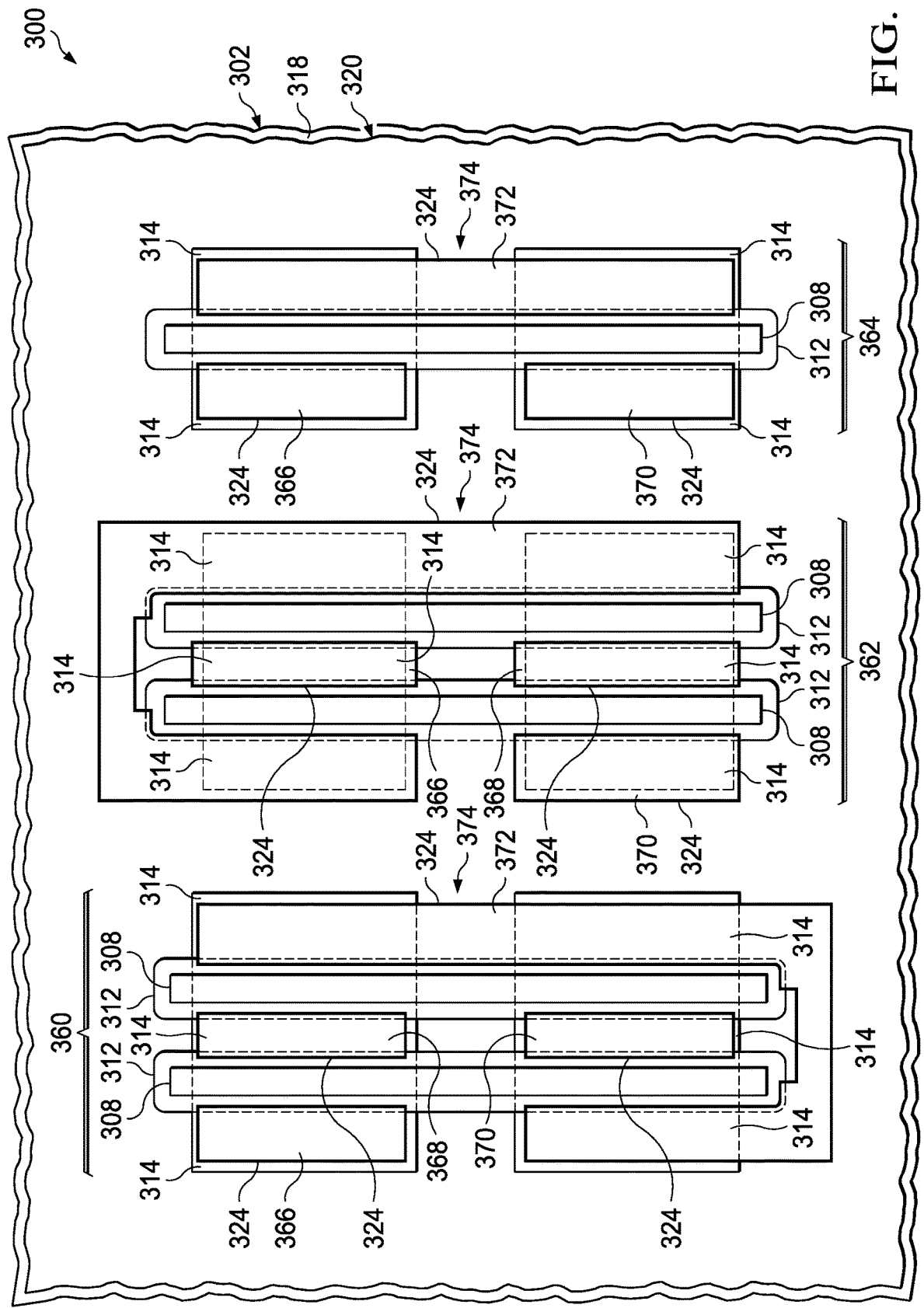

FIG. 3A through FIG. 3C are top views of an example integrated circuit containing self-aligned contacts in logic gates, depicted in successive stages of fabrication. Referring to FIG. 3A, the integrated circuit 300 is formed in and on a substrate 302 which includes semiconductor material. Field oxide 318 is formed at a top surface of the substrate 302, so that openings in the field oxide 318 provide p-channel metal oxide semiconductor (PMOS) active areas 356 for PMOS transistors and n-channel metal oxide semiconductor (NMOS) active areas 358 for NMOS transistors. The integrated circuit 300 includes areas for logic gates, exemplified by a NOR gate 360, a NAND gate 362 and an inverter 364.

The NOR gate 360 includes two MOS gates 308 and sidewalls 312 abutting the MOS gates 308, extending across an instance of the PMOS active areas 356 and an instance of the NMOS active areas 358. The NAND gate 362 includes two MOS gates 308 and sidewalls 312 abutting the MOS gates 308, extending across an instance of the PMOS active areas 356 and an instance of the NMOS active areas 358. The inverter 364 includes an MOS gate 308 and sidewalls 312 abutting the gate 308, extending across an instance of the PMOS active areas 356 and an instance of the NMOS active areas 358. Areas of the PMOS active areas 356 and NMOS active areas 358 adjacent to the MOS gates 308 and sidewalls 312 provide source/drain regions 314.

A gapfill dielectric layer 320 is formed over the integrated circuit 300 and planarized as described in reference to FIG. 1B and FIG. 1C. The integrated circuit 300 may possibly include metal silicide on the source/drain regions 314 and/or a sidewall extension layer at this point. The MOS gates 308 may possibly be replacement gates.

Referring to FIG. 3B, a contact mask 322 is formed over the integrated circuit 300 so as to expose areas for self-aligned contacts. The area exposed in the NOR gate 360 extends across both MOS gates 308 in the PMOS active area 356 and NMOS active area 358 and across the field oxide 318 between the PMOS active area 356 and NMOS active area 358. The area exposed in the NOR gate 360 may be recessed from edges of the PMOS active area 356 and NMOS active area 358, as depicted in FIG. 3B. Alternatively, the area exposed in the NOR gate 360 may overlap edges of the PMOS active area 356 and NMOS active area 358.

The area exposed in the NAND gate 362 extends across both MOS gates 308 in the PMOS active area 356 and NMOS active area 358 and across the field oxide 318 between the PMOS active area 356 and NMOS active area 358. The area exposed in the NAND gate 362 may overlap edges of the PMOS active area 356 and NMOS active area 358, as depicted in FIG. 3B. Alternatively, the area exposed in the NAND gate 362 may be recessed from edges of the PMOS active area 356 and NMOS active area 358.

The area exposed in the inverter 364 extends across both MOS gates 308 in the PMOS active area 356 and NMOS active area 358 and across the field oxide 318 between the PMOS active area 356 and NMOS active area 358. The area exposed in the inverter 364 may be recessed from edges of the PMOS active area 356 and NMOS active area 358, as depicted in FIG. 3B, or may overlap edges of the PMOS active area 356 and NMOS active area 358.

A contact etch process removes the gapfill dielectric layer 320 in the areas exposed by the contact mask 322, as described in reference to FIG. 1E. A sidewall extension layer, if present, may be anisotropically etched as described in reference to FIG. 2G. The contact mask 322 is removed after the contact etch process is completed. Metal silicide may be formed on the source/drain regions 314 at this time, if not already present.

Referring to FIG. 3C, a layer of contact metal is formed on the integrated circuit 300 and planarized so as to form self-aligned contacts 324 on the source/drain regions 314, as described in reference to FIG. 1F and FIG. 1G. In the NOR gate 360, the self-aligned contacts 324 provide a Vdd contact 366 to a PMOS transistor, a contact 368 between two PMOS transistors, a Vss contact 370 to two NMOS transistors and an output contact 372 which connects to a PMOS transistor and two NMOS transistors and a portion of which is a local interconnect 374. In the NAND gate 362, the self-aligned contacts 324 provide a Vdd contact 366 to two PMOS transistors, a contact 368 between two NMOS transistors, a Vss contact 370 to an NMOS transistor and an output contact 372 which connects to two PMOS transistors and an NMOS transistor and a portion of which is a local interconnect 374. In the inverter 364, the self-aligned contacts 324 provide a Vdd contact 366 to a PMOS transistor, a Vss contact 370 to an NMOS transistor and an output contact 372 which connects to a PMOS transistor and an NMOS transistor and a portion of which is a local interconnect 374. Forming the self-aligned contacts 324 as described in reference to FIG. 3A through FIG. 3C may advantageously provide low resistance connections to the NOR gate 360, the NAND gate 362, and the inverter 364, while advantageously providing process latitude in formation of the contact mask 322 of FIG. 3B.

Figure 4A:
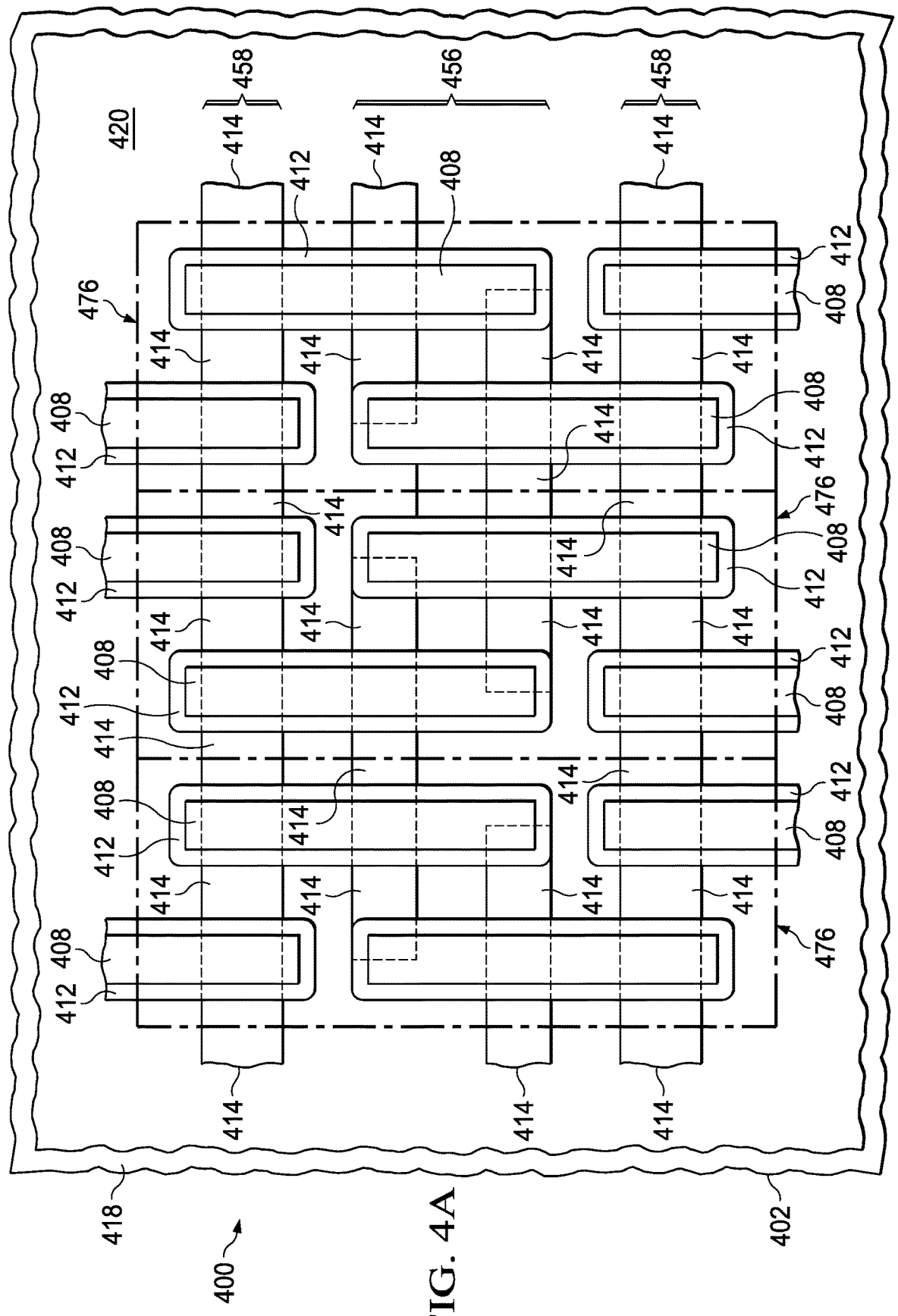
FIG. 4A through FIG. 4C are top views of an example integrated circuit containing self-aligned contacts in static random access memory (SRAM) cells, depicted in successive stages of fabrication.
Figure 4B:
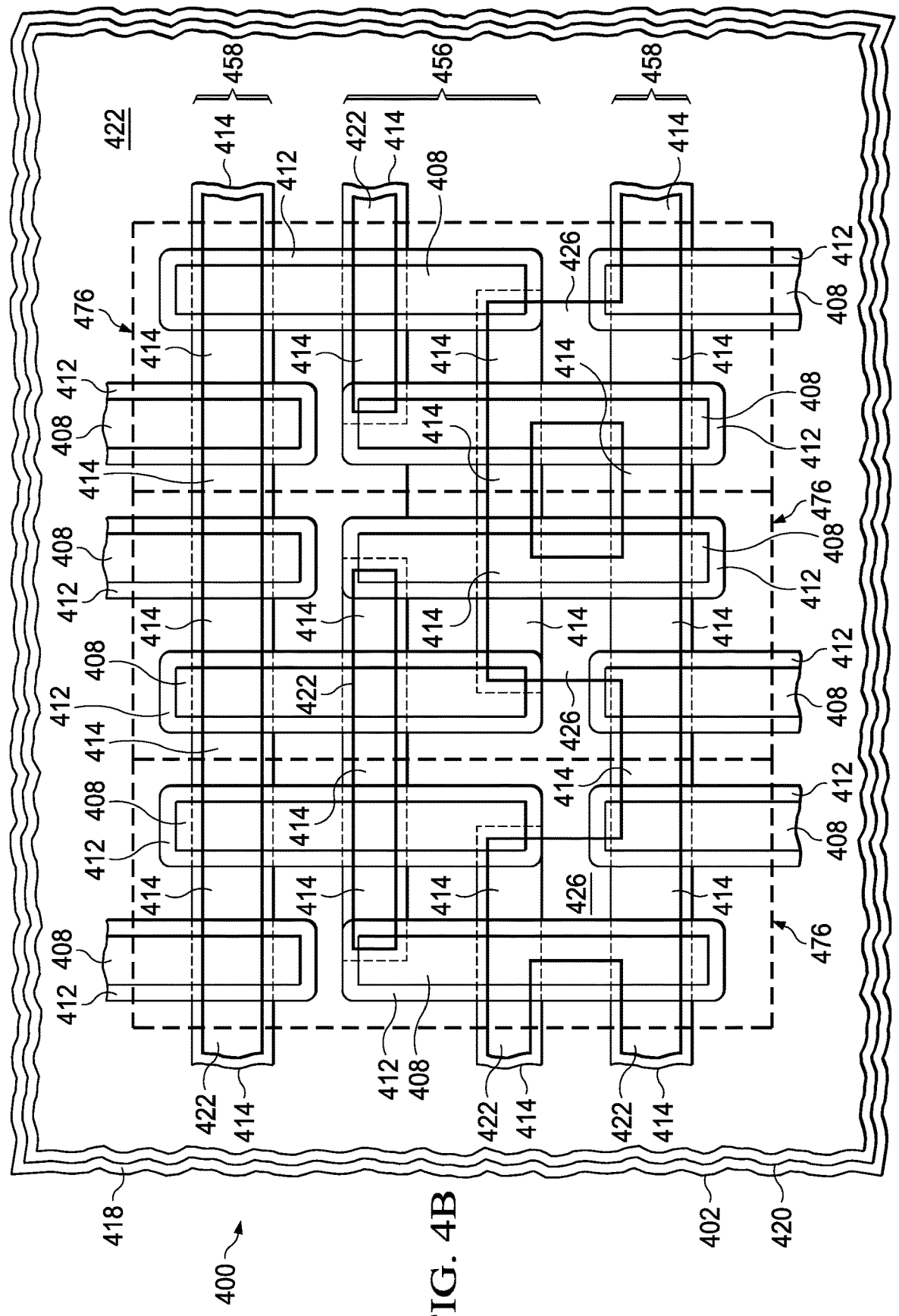
Figure 4C:
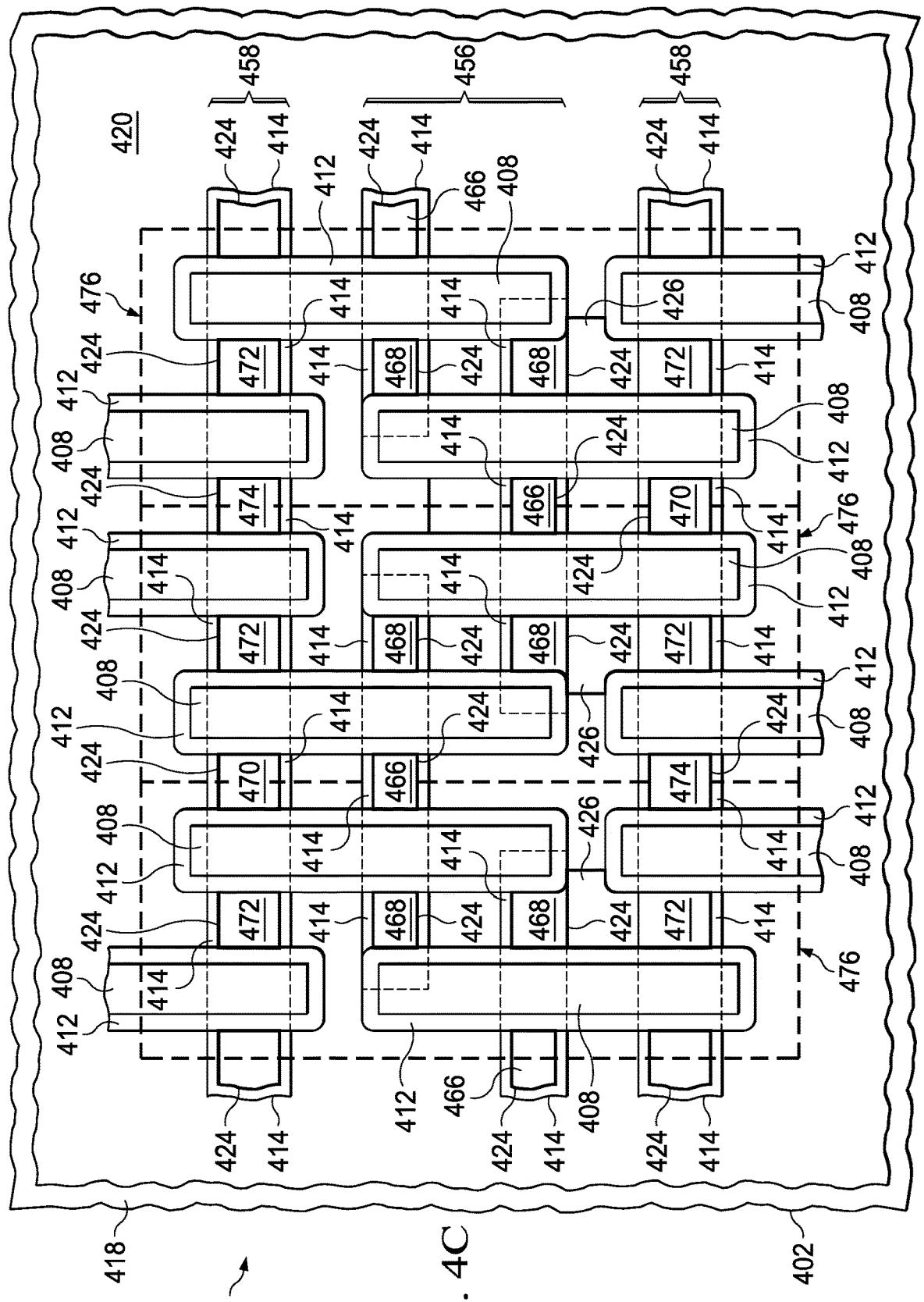

FIG. 4A through FIG. 4C are top views of an example integrated circuit containing self-aligned contacts in SRAM cells, depicted in successive stages of fabrication. Referring to FIG. 4A, the integrated circuit 400 is formed in and on a substrate 402 which includes semiconductor material. Field oxide 418 is formed at a top surface of the substrate 402, so that openings in the field oxide 418 provide PMOS active areas 456 for PMOS transistors and NMOS active areas 458 for NMOS transistors. The integrated circuit 400 includes areas for SRAM cells 476. The SRAM cells 476 include gates 408 surrounded by sidewalls 412. Areas of the PMOS active areas 456 and NMOS active areas 458 adjacent to the gates 408 and sidewalls 412 provide source/drain regions 414.

A gapfill dielectric layer 420 is formed over the integrated circuit 400 and planarized as described in reference to FIG. 1B and FIG. 1C. The integrated circuit 400 may possibly include metal silicide on the source/drain regions 414 and/or a sidewall extension layer at this point. The gates 408 may possibly be replacement gates.

Referring to FIG. 4B, a contact mask 422 is formed over the integrated circuit 400 so as to expose areas for self-aligned contacts. The areas exposed in the PMOS active areas 456 overlap the gates 408, and the areas exposed in the NMOS active area 458 overlap the gates 408. Areas for local interconnect 426 may optionally be exposed; FIG. 4B depicts a portion of the SRAM cells 476 with exposed areas for the local interconnects 426.

A contact etch process removes the gapfill dielectric layer 420 in the areas exposed by the contact mask 422, as described in reference to FIG. 1E. A sidewall extension layer, if present, may be anisotropically etched as described in reference to FIG. 2G. The contact mask 422 is removed after the contact etch process is completed. Metal silicide may be formed on the source/drain regions 414 at this time, if not already present.

Referring to FIG. 4C, a layer of contact metal is formed on the integrated circuit 400 and planarized so as to form self-aligned contacts 424 on the source/drain regions 414 and optionally form local interconnects 426, as described in reference to FIG. 1F and FIG. 1G. In the PMOS active areas 456, the self-aligned contacts 424 provide a Vdd contact 466 and two drain contacts 468 to adjacent pairs of PMOS load transistors. In the NMOS active area 458, the self-aligned contacts 424 provide Vss contacts 470 to adjacent pairs of NMOS driver transistors, data node contacts 472 between the NMOS driver transistors and adjacent NMOS passgate transistors, and bitline contacts 474 between adjacent pairs of the NMOS passgate transistors. The optional local interconnects 426 may connect adjacent drain contacts 468 of the PMOS load transistors and data node contacts 472. Forming the self-aligned contacts 424 as described in reference to FIG. 4A through FIG. 4C may advantageously provide low resistance connections to the SRAM cells 476, while advantageously providing process latitude in formation of the contact mask 422 of FIG. 4B. Forming the local interconnects 426 may simplify interconnects such as vias and a first level of metal interconnects over the self-aligned contacts 424 and local interconnects 426.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming an integrated circuit, comprising:
forming a first gate structure comprising a first metal gate disposed over a substrate and first and second sidewall spacers abutting lateral surfaces of the metal gate;
forming a first source/drain region disposed in the substrate adjacent to the first gate structure;
forming a first metal silicide region over the first source/drain region at a surface of the substrate; and
forming a first contact disposed over the first source/drain region and abutting the first sidewall spacer from the first metal silicide region to a top surface of the first gate structure, wherein a top surface of the first contact is not higher than a top surface of the first metal gate.

2. The method of claim 1, further comprising:
forming a pre metal dielectric (PMD) layer disposed over the first gate structure and over the first contact;
forming a via disposed in the PMD layer, such that the via makes electrical connection to the first contact; and
forming a metal interconnect disposed over the via, the metal interconnect making electrical connection to the via.

3. The method of claim 1, further comprising forming a second gate structure with a second metal gate and third and fourth sidewall spacers, wherein the first contact is disposed between, and abuts each of the first and third sidewall spacers from the first metal silicide region to the top surface of the first gate structure.

4. The method of claim 1, further comprising forming a second contact abutting the second sidewall spacer on an opposite side of the first gate structure from the first contact, wherein the second contact abuts the second sidewall spacer from a second metal silicide region to the top surface of the first gate structure.

5. The method of claim 1, wherein the first and second sidewall spacers comprise silicon nitride.

6. The method of claim 1, wherein the first and second sidewall spacers further comprise a sidewall extension layer, so that the first contact abuts the sidewall extension layer of the first gate structure.

7. The method of claim 6, wherein the sidewall extension layer comprises silicon nitride.

8. A method of forming an integrated circuit, comprising:
forming a plurality of gate structures, each gate structure comprising a gate disposed over a substrate and sidewalls abutting lateral surfaces of the gate;
forming source/drain regions disposed in the substrate adjacent to the gate structures;
forming a plurality of contacts, each of the contacts being disposed over one of the source/drain regions and abutting at least one of the plurality of gate structures along a height of the at least one gate structure, wherein a top surface of the contact is not higher than a top surface of the at least one gate structure; and
forming a local interconnect of a same metal as the plurality of contacts, the local interconnect extending over field oxide disposed over the substrate, wherein a top surface of the local interconnect is not higher than a top surface of a first gate structure of the plurality of gate structures.

9. The method of claim 8, further comprising:
forming a pre metal dielectric (PMD) layer disposed over the plurality of gate structures and over the plurality of contacts;
forming vias disposed in the PMD layer, such that the vias make conductive connections to at least a subset of the plurality of contacts; and
forming a plurality of metal interconnects disposed over the vias, the metal interconnects making conductive connections to the vias.

10. The method of claim 8, wherein forming the plurality of contacts includes:
forming a first contact disposed over a first source/drain region of the source/drain regions, wherein the first source/drain region is part of a p-channel metal oxide semiconductor (PMOS) transistor of a logic gate; and
forming a second contact of the plurality of contacts disposed over a second source/drain region of the source/drain regions, the second source/drain region being part of an n-channel metal oxide semiconductor (NMOS) transistor of the logic gate,
wherein the first contact and the second contact are conductively connected through the local interconnect.

11. The method of claim 10, wherein a first contact of the plurality of contacts is disposed between, and abuts both of, the first gate structure and a second gate structure of the plurality of gate structures in a logic gate.

12. The method of claim 10, wherein each of the gate structures further comprises a sidewall extension layer disposed on the sidewalls, so that each of the plurality of contacts abuts the sidewall extension layer of an adjacent one of the plurality of gate structures.

13. A method of forming an integrated circuit, comprising:
forming a plurality of gate structures over a substrate including forming gates over the substrate and forming sidewalls of dielectric material abutting lateral surfaces of the gates;
forming source/drain regions in the substrate adjacent to the gate structures;
forming a gapfill dielectric layer over the substrate between adjacent gate structures of the plurality of gate structures, so that a top surface of the gapfill dielectric layer between the adjacent gate structures is substantially coplanar with top surfaces of the adjacent gate structures;
forming a contact mask over the gapfill dielectric layer which exposes areas for self-aligned contacts;
removing the gapfill dielectric layer in the areas for the self-aligned contacts between the adjacent gate structures;
forming a layer of contact metal over the adjacent gate structures, extending between the adjacent gate structures in the areas for the self-aligned contacts;
removing the contact metal from over the adjacent gate structures by a planarization process to form the self-aligned contacts, so that a plurality of the self-aligned contacts make conductive connections to the source/drain regions and abut the adjacent gate structures along heights of the adjacent gate structures, and so that a top surface of each of the self-aligned contacts is not higher than a top surface of the adjacent gate structures abutting the self-aligned contact;
forming a PMD layer over the gate structures and the self-aligned contacts;
forming vias through the PMD layer that conductively connect to the self-aligned contacts; and
forming metal interconnects on the vias.

14. The method of claim 13, further comprising the step of forming metal silicide over the source/drain regions prior to the step of forming the gapfill dielectric layer.

15. The method of claim 13, further comprising the step of forming metal silicide over the source/drain regions after the step of removing the gapfill dielectric layer in areas for self-aligned contacts.

16. The method of claim 13, further comprising removing the gates and forming replacement gates, after the step of removing the contact metal from over the adjacent gate structures.

17. The method of claim 13, further comprising removing the gates and forming replacement gates, after the step of forming the gapfill dielectric layer and prior to the step of forming the contact mask.

18. A method of forming an integrated circuit, comprising:
forming a first gate structure comprising a first gate disposed over a substrate and a first sidewall spacer abutting a first side surface of the first gate;
forming a first source/drain region disposed in the substrate adjacent to the first gate structure;
forming a first metal silicide region over the first source/drain region at a surface of the substrate;
forming a pre metal dielectric (PMD) layer disposed over the first gate structure and having a bottom surface coplanar with the a top surface of the first gate;
forming a first contact disposed over the first source/drain region and abutting the first sidewall spacer from the first metal silicide region to the bottom surface of the PMD layer.

19. The method of claim 18, further comprising forming a via disposed in the PMD layer, such that the via makes an electrical connection to the first contact.

20. The method of claim 18, further comprising forming a second gate structure with a second metal gate and a second sidewall spacer, wherein the first contact is disposed between, and abuts each of the first and second sidewall spacers.

21. The method of claim 18, further comprising forming a third sidewall spacer abutting the first gate at a second side surface opposite the first sidewall surface, and forming a second contact abutting the third sidewall spacer from a second metal silicide region to the bottom surface of PMD layer.

22. The method of claim 18, wherein the first sidewall spacer comprises silicon nitride.

23. The method of claim 18, wherein the first sidewall spacer comprises a sidewall extension layer, so that the first contact abuts the sidewall extension layer.

24. The method of claim 23, wherein the sidewall extension layer comprises silicon nitride.

* * * * *